US012720886B2

(12) United States Patent
Chang et al.

(10) Patent No.: US 12,720,886 B2
(45) **Date of Patent: *Aug. 25, 2026**

(54) IMAGE SENSOR AND ELECTRONIC SYSTEM INCLUDING THE SAME

(71) Applicant: Samsung Electronics Co., Ltd., Suwon-si (KR)

(72) Inventors: Kyoungeun Chang, Suwon-si (KR); Sungin Kim, Suwon-si (KR); Jameyung Kim, Suwon-si (KR); Incheol Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 511 days.

This patent is subject to a terminal disclaimer.

(21) Appl. No.: 18/344,398

(22) Filed: Jun. 29, 2023

(65) Prior Publication Data

US 2024/0162256 A1 May 16, 2024

(30) Foreign Application Priority Data

Nov. 11, 2022 (KR) ........................ 10-2022-0150967

(51) Int. Cl.

*H10F 39/00* (2025.01)
*H10D 62/17* (2025.01)
*H10D 64/27* (2025.01)

(52) U.S. Cl.

CPC ..... *H10F 39/80373* (2025.01); *H10D 62/235* (2025.01); *H10D 64/513* (2025.01); *H10D 64/518* (2025.01); *H10D 64/519* (2025.01)

(58) Field of Classification Search

None

See application file for complete search history.

(56) References Cited

U.S. PATENT DOCUMENTS 7,364,960 B2 4/2008 Lyu
7,535,037 B2 5/2009 Lyu
(Continued)

FOREIGN PATENT DOCUMENTS

JP 2022010457 A 1/2022
KR 1020060034926 A 4/2006
(Continued)

OTHER PUBLICATIONS

Extended European Search Report corresponding to EP 23190739.5; dated Mar. 4, 2024, (6 pages).

*Primary Examiner* — Bilkis Jahan

(74) *Attorney, Agent, or Firm* — Wolf, Greenfield & Sacks, P.C.

(57) ABSTRACT

Provided are an image sensor and an electronic system including the same. An image sensor includes a substrate having a pixel region in which an active region is defined, and a gate electrode on the active region, wherein the active region includes an edge portion extending along an outline of a top surface thereof, the edge portion including a local round edge portion having a first radius of curvature that is greater than a second radius of curvature of other portions of the edge portion, wherein the gate electrode includes a lateral gate portion on a portion of the top surface of the active region, a vertical gate portion on a sidewall of the active region, and a round inner corner portion integrally connected to the lateral gate portion and the vertical gate portion, the round inner corner portion facing the local round edge portion.

20 Claims, 32 Drawing Sheets

(56) References Cited

U.S. PATENT DOCUMENTS 7,741,143 B2 6/2010 Paik et al.
7,863,658 B2 1/2011 Ho et al.
8,809,990 B2 8/2014 Maeda et al.
9,443,900 B2 9/2016 Yamashita
9,577,000 B2 2/2017 Park et al.
9,997,556 B2 6/2018 Hwang
10,600,828 B2 3/2020 Kudoh
11,412,166 B2 8/2022 Fujita et al.
2002/0008767 A1* 1/2002 Lee ....................... H10F 39/182 348/340
2006/0084195 A1* 4/2006 Lyu ....................... H10F 39/803 257/E27.131
2007/0034965 A1 2/2007 Jung et al.
2011/0086459 A1 4/2011 Ho et al.
2013/0320407 A1* 12/2013 Ahn ...................... H10F 39/807 257/239
2014/0327059 A1 11/2014 Ammo
2017/0062616 A1 3/2017 Wu et al.
2018/0069041 A1 3/2018 Milic-strkalj
2018/0182795 A1 6/2018 Kim et al.
2019/0123079 A1* 4/2019 Kudoh ................. H10D 64/513
2020/0135777 A1 4/2020 Zhao et al.
2020/0266223 A1 8/2020 Takahashi
2021/0193715 A1 6/2021 Mccarten
2021/0266482 A1 8/2021 Ammo
2021/0305298 A1* 9/2021 Hu ........................ H10F 39/014
2021/0320139 A1 10/2021 Sze et al.
2021/0358980 A1 11/2021 Oh et al.
2022/0068981 A1 3/2022 Jung et al.
2022/0181364 A1 6/2022 Miyake et al.

FOREIGN PATENT DOCUMENTS

KR 100644019 B1 11/2006
KR 100678466 B1 2/2007
KR 1020130058402 A 6/2013
KR 10-2015-0099119 A 8/2015
KR 1020200126477 A 11/2020
KR 1020210141935 A 11/2021
KR 102354420 B1 1/2022
KR 1020220029072 A 3/2022

* cited by examiner

IMAGE SENSOR AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0150967, filed on Nov. 11, 2022, in the Korean Intellectual Property Office, the disclosure of which is incorporated by reference herein in its entirety.

BACKGROUND

The inventive concept relates to an image sensor and an electronic system including the image sensor, and more particularly, to an image sensor including a transistor and an electronic system including the image sensor.

Image sensors that acquire images and convert the acquired images into electrical signals have been used in various fields, such as digital cameras, camcorders, personal communication systems (PCS), game devices, security cameras, and medical micro cameras, with the development of the computer industry and the communication industry. As image sensors become highly integrated and pixel sizes are miniaturized, there is a need for an image sensor including a transistor having a structure that may provide stable electrical characteristics.

SUMMARY

The inventive concept provides an image sensor, which may improve noise characteristics of pixels even when image sensors are highly integrated and a pixel size is reduced or miniaturized, and may improve electrical properties of a transistor and low-luminance resolution not only by increasing a channel area of the transistor but also by ensuring a required level of limit voltage.

The inventive concept also provides an electronic system including an image sensor, which may improve noise characteristics of pixels even when image sensors are highly integrated and a pixel size is miniaturized, and may improve electrical properties of a transistor and low-luminance resolution not only by increasing a channel area of the transistor but also by ensuring a required level of limit voltage.

According to an aspect of the inventive concept, there is provided an image sensor including a substrate having a pixel region in which an active region is defined, and a gate electrode on the active region, wherein the active region includes a top surface, a plurality of sidewalls extending in different directions from the top surface, and an edge portion extending along an outline of the top surface between the top surface and the plurality of sidewalls, the edge portion including a local round edge portion having a first radius of curvature that is greater than a second radius of curvature of other portions of the edge portion, wherein the gate electrode includes a lateral gate portion on a portion of the top surface of the active region, a vertical gate portion on one sidewall adjacent to the local round edge portion, from among the plurality of sidewalls of the active region, and a round inner corner portion integrally connected to the lateral gate portion and the vertical gate portion, the round inner corner portion facing the local round edge portion.

According to another aspect of the inventive concept, there is provided an image sensor including a substrate having a pixel region in which an active region is defined by a device isolation insulating structure, and a source follower transistor including a gate electrode on a portion of the active region, wherein the active region includes an edge portion extending along an outline of a top surface of the active region, the edge portion including a normal edge portion in contact with the device isolation insulating structure and a local round edge portion apart from the device isolation insulating structure, and a first radius of curvature of the local round edge portion is greater than a second radius of curvature of the normal edge portion, wherein the gate electrode includes a lateral gate portion on a portion of the top surface of the active region, a vertical gate portion on one sidewall adjacent to the local round edge portion, from among a plurality of sidewalls of the active region, and a round inner corner portion integrally connected to the lateral gate portion and the vertical gate portion, the round inner corner portion facing the local round edge portion.

According to another aspect of the inventive concept, there is provided an electronic system including at least one camera module including an image sensor, and a processor configured to process image data received from the at least one camera module, wherein the image sensor includes a substrate having a pixel region in which an active region is defined, and a gate electrode on the active region, wherein the active region includes a top surface, a plurality of sidewalls extending in different directions from the top surface, and an edge portion extending along an outline of the top surface between the top surface and the plurality of sidewalls, the edge portion including a local round edge portion having a first radius of curvature that is greater than a second radius of curvature of other portions of the edge portion, wherein the gate electrode includes a lateral gate portion on a portion of the top surface of the active region, a vertical gate portion on one sidewall adjacent to the local round edge portion, from among the plurality of sidewalls of the active region, and a round inner corner portion integrally connected to the vertical gate portion, the round inner corner portion facing the local round edge portion.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
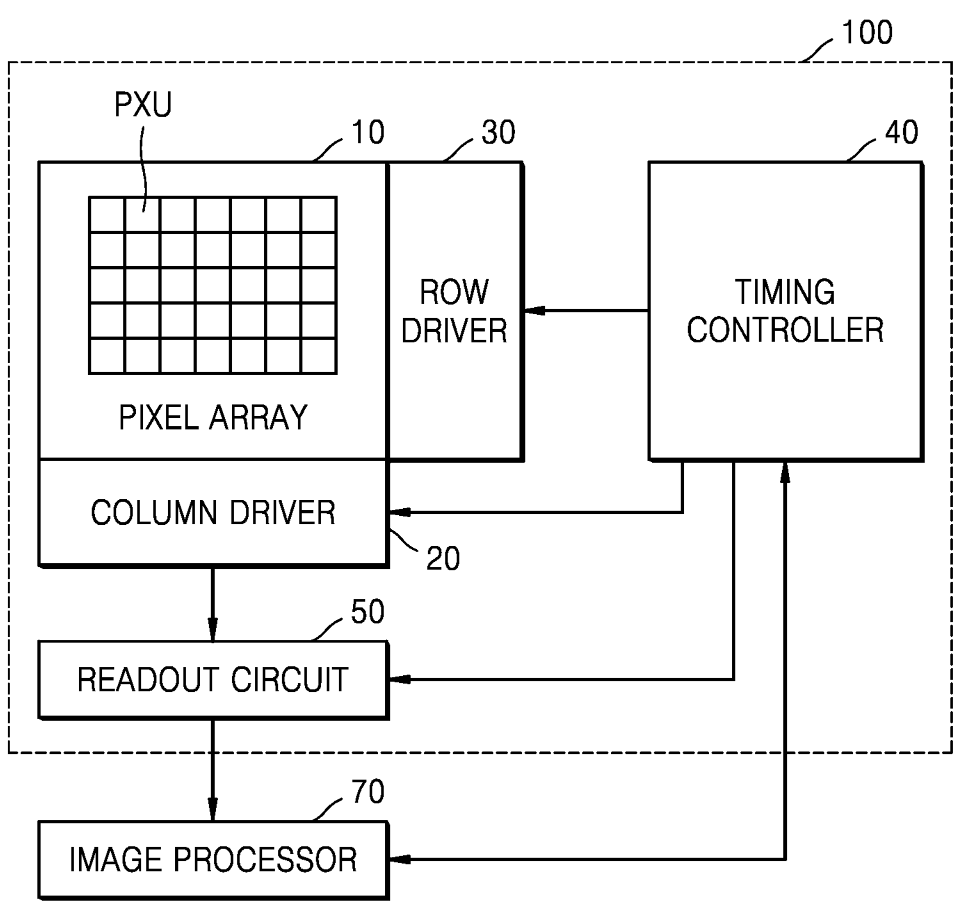
FIG. 1 is a block diagram of an image sensor according to an embodiment.

Hereinafter, embodiments will be described in detail with reference to the accompanying drawings. The same reference numerals are used to denote the same elements in the drawings, and repeated descriptions thereof are omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a block diagram of an image sensor 100 according to an embodiment.

Referring to FIG. 1, the image sensor 100 according to embodiments may include a pixel array 10 and circuits configured to control the pixel array 10. In embodiments, the circuits configured to control the pixel array 10 may include a column driver 20, a row driver 30, a timing controller 40, and a readout circuit 50.

The image sensor 100 may operate in response to a control command received from an image processor 70. The image sensor 100 may convert light transmitted from an external object into an electrical signal and output the electrical signal to the image processor 70. The image sensor 100 may be a complementary metal-oxide-semiconductor (CMOS) image sensor.

The pixel array 10 may include a plurality of unit pixels PXU having a two-dimensional (2D) array structure arranged in a matrix form along a plurality of row lines and a plurality of column lines.

Each of the plurality of unit pixels PXU may include a photodiode. The photodiode may generate electrical charges in response to receiving light transmitted from the object. The image sensor 100 may be configured to perform an autofocus function by using a phase difference between pixel signals generated from a plurality of photodiodes included in the plurality of unit pixels PXU. Each of the unit pixels PXU may include a pixel circuit configured to generate a pixel signal from the electric charges generated by the photodiode.

The column driver 20 may include a correlated double sampler (CDS), an analog-to-digital converter (ADC), and/or the like. The CDS may be connected, through column lines, to a unit pixel PXU included in a row selected by a row selection signal supplied by the row driver 30 and may perform correlated double sampling to detect a reset voltage and a pixel voltage. The ADC may be configured to convert the reset voltage and the pixel voltage each detected by the CDS into digital signals and transmit the digital signals to the readout circuit 50.

The readout circuit 50 may include a latch or buffer circuit configured to temporarily store the digital signal and/or an amplification circuit. The read circuit 50 may be configured to generate image data by temporarily storing or amplifying the digital signal received from the column driver 20. The operation timing of the column driver 20, the row driver 30, and the readout circuit 50 may be determined by the timing controller 40, and the timing controller 40 may operate based on a control command transmitted from the image processor 70.

The image processor 70 may be configured to signal-process image data output from the readout circuit 50 and output the signal-processed image data to a display device or store the signal-processed image data in a storage device, such as a memory. When the image sensor 100 is mounted on an autonomous vehicle, the image processor 70 may be configured to signal-process image data and transmit the signal-processed image data to a main controller that controls the autonomous vehicle.

Figure 2:
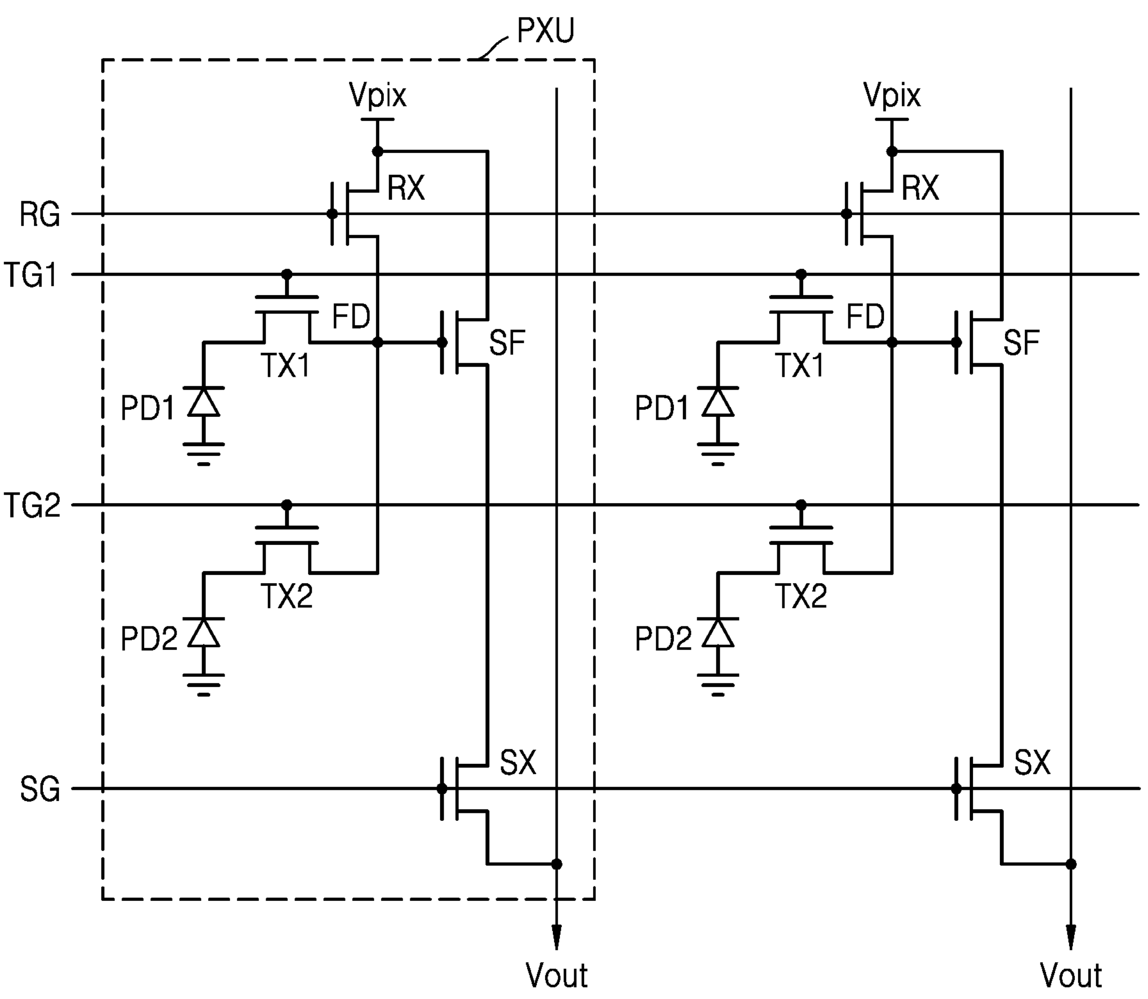
FIG. 2 is a circuit diagram of a unit pixel that may be included in an image sensor, according to an embodiment.

FIG. 2 is a circuit diagram of a unit pixel PXU that may be included in an image sensor 100, according to an embodiment.

Referring to FIG. 2, each of the plurality of unit pixels PXU included in the pixel array 10 of the image sensor 100 shown in FIG. 1 may constitute a 2-shared pixel including two photodiodes, that is, first and second photodiodes PD1 and PD2.

In one unit pixel PXU, the first and second photodiodes PD1 and PD2 may share one floating diffusion region FD with each other by using first and second transfer transistors TX1 and TX2. That is, the first transfer transistor TX1 corresponding to the first photodiode PD1 and the second transfer transistor TX2 corresponding to the second photodiode PD2 may share one floating diffusion region FD as a common drain region with each other.

In the one unit pixel PXU, a reset transistor RX, a source follower transistor SF, and a selection transistor SX may be shared between the first and second photodiodes PD1 and PD2. Gate electrodes of the reset transistor RX, the first and second transfer transistors TX1, and TX2, and the selection transistor SX may be respectively connected to driving signal lines RG, TG1, TG2, and SG. The first and second photodiodes PD1 and PD2 may constitute source regions of the first and second transfer transistors TX1 and TX2 corresponding respectively thereto. The floating diffusion region FD may constitute a common drain region of the first and second transfer transistors TX1 and TX2. The floating diffusion region FD may be connected to each of a source region of the reset transistor RX and a gate electrode of the source follower transistor SF. A drain region of the reset transistor RX and a drain region of the source follower transistor SF may be connected to a power supply voltage Vpix. A source region of the source follower transistor SF and a drain region of the selection transistor SX may be shared with each other. An output voltage Vout may be connected to a source region of the selection transistor SX.

The first and second photodiodes PD1 and PD2 may generate and accumulate charges in proportion to the amount of light incident from the outside. The gate electrodes of the first and second transfer transistors TX1 and TX2 may transfer the charges accumulated in the first and second photodiodes PD1 and PD2 to the floating diffusion region FD. Complementary signals may be respectively applied from the driving signal lines TG1 and TG2 to the gate electrodes of the first and second transfer transistors TX1 and TX2, and the charges may be transferred from any one of the first and second photodiodes PD1 and PD2 to the floating diffusion region FD. The floating diffusion region FD may receive and store the charges generated by the first and second photodiodes PD1 and PD2.

The floating diffusion region FD may be periodically reset by the reset transistor RX. When the reset transistor RX is turned on by a reset signal, the power supply voltage Vpix supplied to the reset transistor RX may be transferred to the floating diffusion region FD, and charges accumulated in the floating diffusion region FD may be emitted. Accordingly, the floating diffusion region FD may be reset.

The gate electrode of the source follower transistor SF may be connected to the floating diffusion region FD. The source follower transistor SF may function as a source follower buffer amplifier and amplify a change in electric potential of the floating diffusion region FD. A pixel signal amplified by the source follower transistor SF may be output to an output line through the selection transistor SX. The drain region of the source follower transistor SF may be connected to the power supply voltage Vpix, and the source region of the source follower transistor SF may be connected to the drain region of the selection transistor SX.

The selection transistor SX may select a unit pixel PXU to be read in units of rows. When the selection transistor SX is turned on, the power supply voltage Vpix connected to the drain region of the source follower transistor SF may be transferred to the drain region of the selection transistor SX.

Figure 3:
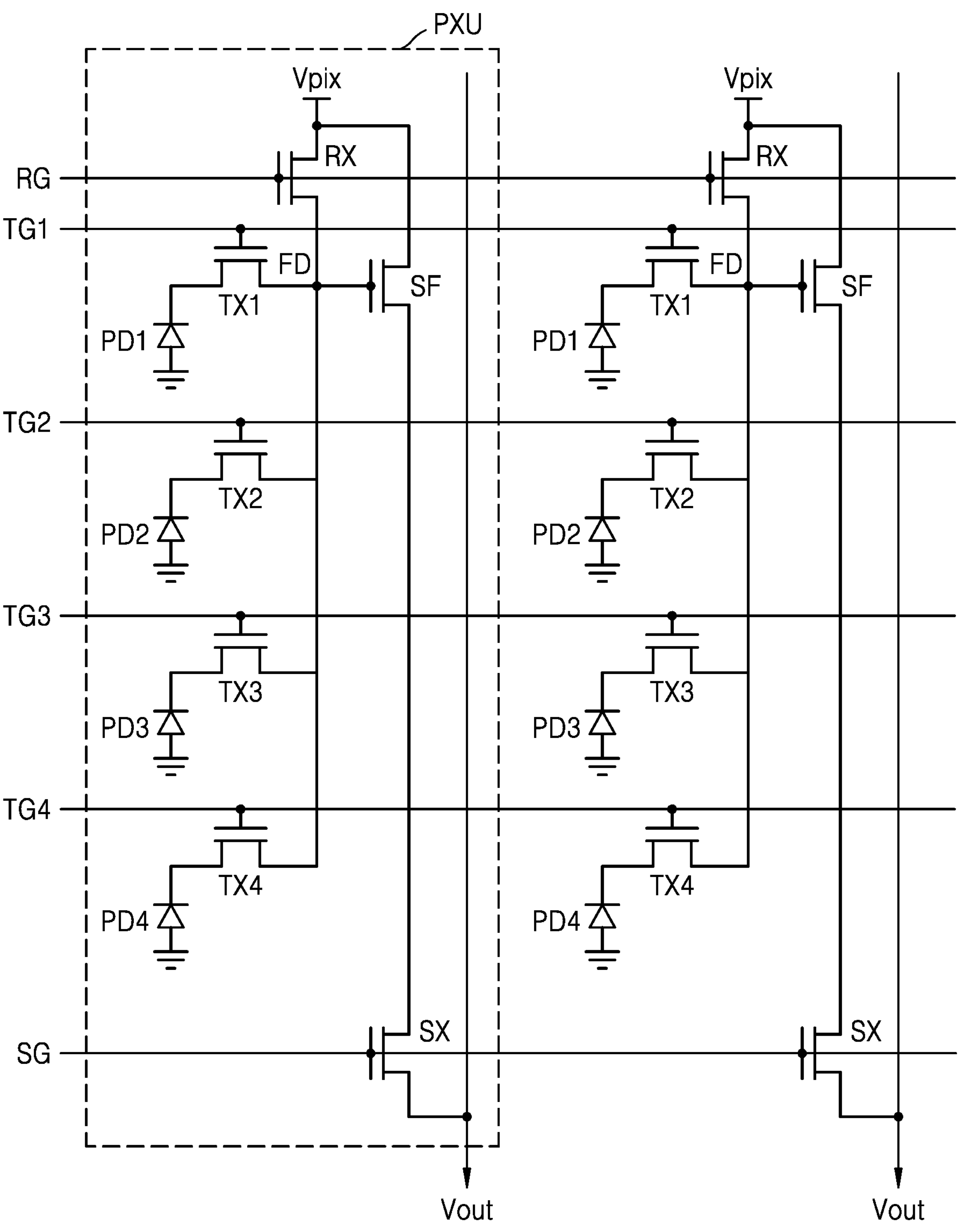
FIG. 3 is a circuit diagram of a unit pixel that may be included in an image sensor, according to an embodiment.

FIG. 3 is a circuit diagram of a unit pixel PXU that may be included in an image sensor 100, according to an embodiment.

Referring to FIG. 3, each of the plurality of unit pixels PXU included in the pixel array 10 of the image sensor 100 shown in FIG. 1 may constitute a 4-shared pixel including four photodiodes, that is, first to fourth photodiodes PD1, PD2, PD3, and PD4. In one unit pixel PXU, the first to fourth photodiodes PD1, PD2, PD3, and PD4 may share one floating diffusion region FD with each other by using first to fourth transfer transistors TX1, TX2, TX3, and TX4. The first transfer transistor TX1 corresponding to the first photodiode PD1, the second transfer transistor TX2 corresponding to the second photodiode PD2, the third transfer transistor TX3 corresponding to the third photodiode PD3, and the fourth transfer transistor TX4 corresponding to the fourth photodiode PD4 may share one floating diffusion region FD as a common drain region with each other. In the one unit pixel PXU, a reset transistor RX, a source follower transistor SF, and a selection transistor SX may be shared among the first to fourth photodiodes PD1, PD2, PD3, and PD4. In response to signals applied to the first to fourth transfer transistors TX1, TX2, TX3, and TX4 through driving signal lines TG1, TG2, TG3, and TG4, charges may be transferred from one of the first to fourth photodiodes PD1, PD2, PD3, and PD4 to the floating diffusion region FD.

The image sensor 100 according to embodiments may detect a reset voltage and a pixel voltage from each of the unit pixels PXU each having the circuit configuration illustrated in FIG. 2 or FIG. 3 and obtain a pixel signal by calculating a difference between the reset voltage and the pixel voltage. The pixel voltage may be a voltage reflecting electrical charges generated by a photodiode included in each of the plurality of unit pixels PXU illustrated in FIG. 1.

The unit pixel PXU included in the image sensor 100 is illustrated as constituting the 2-shared pixel or the 4-shared pixel in FIGS. 2 and 3, but embodiments of the inventive concept are not limited thereto. A unit pixel PXU according to an embodiment may constitute an N-shared pixel including N photodiodes (N is an integer of 2 or more). For example, each of the plurality of pixel units PXU included in the image sensor 100 may include a 2-shared pixel including 2 photodiodes, a 4-shared pixel including 4 photodiodes, or an 8-shared pixel including 8 photodiodes.

Figure 4A:
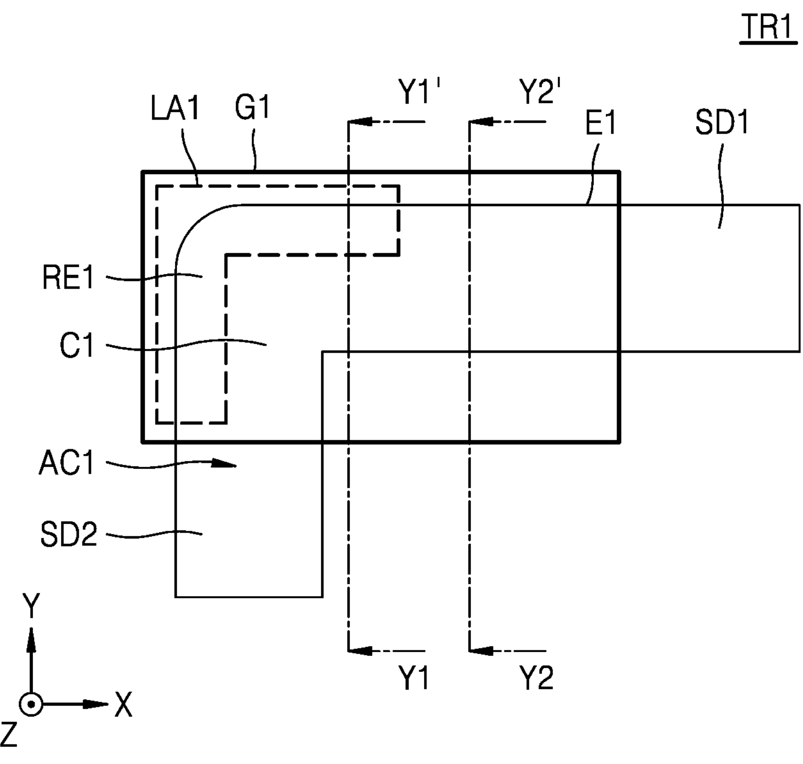
FIG. 4A is a plan layout diagram of a transistor according to embodiments.
Figure 4B:
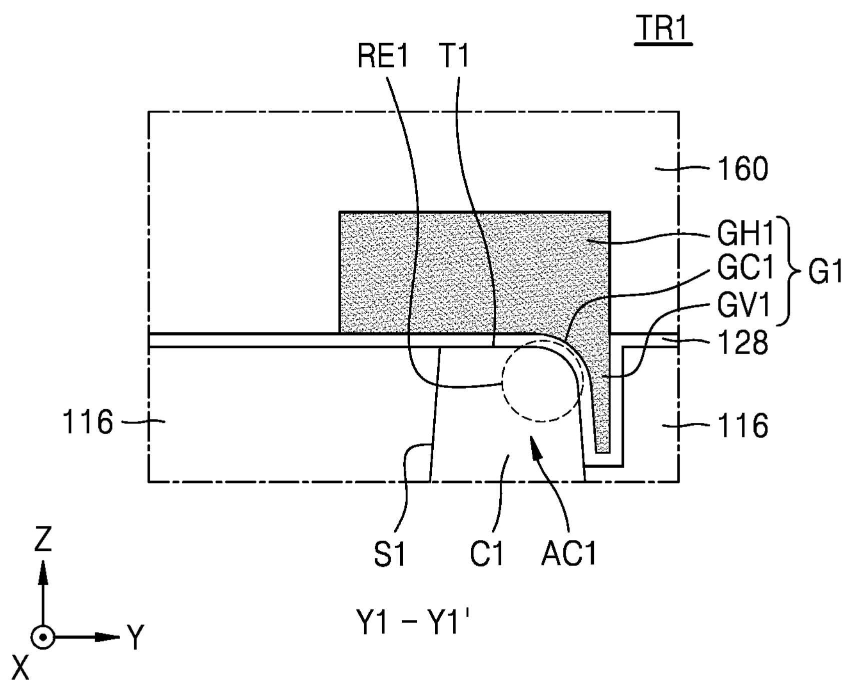
FIG. 4B is a cross-sectional view taken along line Y1-Y1' of FIG. 4A.
Figure 4C:
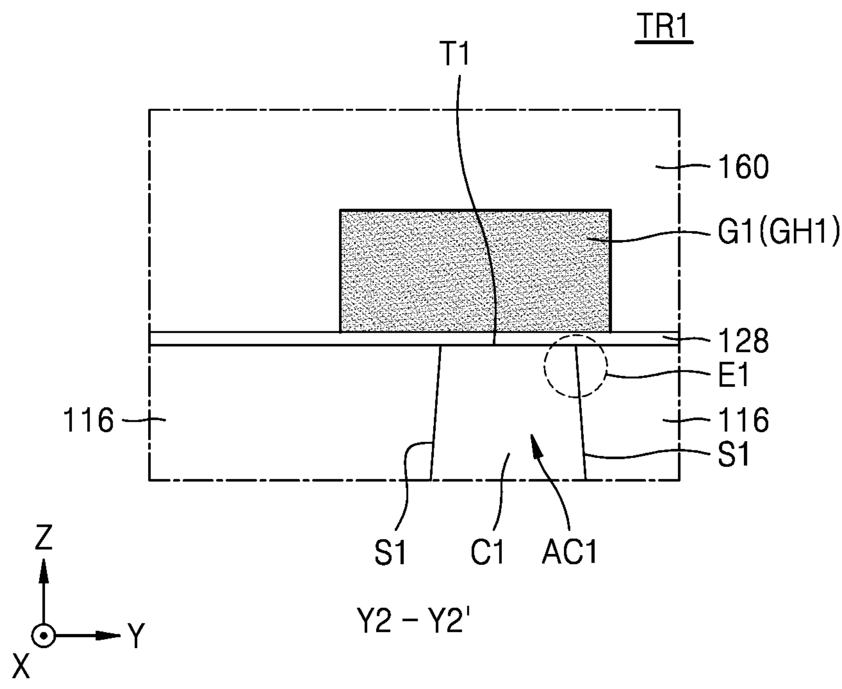
FIG. 4C is a cross-sectional view taken along line Y2-Y2' of FIG. 4A.

FIGS. 4A, 4B, and 4C are diagrams of a transistor TR1 according to embodiments. More specifically, FIG. 4A is a plan layout diagram of the transistor TR1. FIG. 4B is a cross-sectional view of an example configuration according to the cross-section taken along line Y1-Y1' of FIG. 4A. FIG. 4C is a cross-sectional view of an example configuration according to the cross-section taken along line Y2-Y2' of FIG. 4A. The transistor TR1 shown in FIGS. 4A, 4B, and 4C may constitute an image sensor according to embodiments. In embodiments, the transistor TR1 shown in FIGS. 4A, 4B, and 4C may constitute one or more of the reset transistor RX, the source follower transistor SF, the selection transistor SX, and the first and second transfer transistors TX1 and TX2, which are shown in FIG. 2. In other embodiments, the transistor TR1 may constitute one or more of the reset transistor RX, the source follower transistor SF, the selection transistor SX, and the first to fourth transfer transistors TX1, TX2, TX3, and TX4, which are shown in FIG. 3.

Referring to FIGS. 4A, 4B, and 4C, the transistor TR1 may include an active region AC1 and a gate electrode G1 on the active region AC1.

The active region AC1 may be defined by a device isolation insulating structure 116. The active region AC1 may include a semiconductor layer. In embodiments, the active region AC1 may include a semiconductor layer doped with P-type impurities. For example, the active region AC1 may include a semiconductor layer including silicon (Si), germanium (Ge), silicon germanium (SiGe), a group II-VI compound semiconductor, a group III-V compound semiconductor, or a combination thereof, without being limited thereto. The device isolation insulating structure 116 may include an insulating film, which includes a silicon oxide film, a silicon nitride film, or a combination thereof, without being limited thereto. The gate electrode G1 may include doped polysilicon. For example, the gate electrode G1 may include polysilicon doped with N-type impurities, such as phosphorus (P) or arsenic (As).

The active region AC1 may include a first source/drain region SD11, a second source/drain region SD2, and a channel region C1 between the first source/drain region SD11 and the second source/drain region SD2 in the active region AC1. A gate dielectric film 128 may be between the active region AC1 and the gate electrode G1. The gate dielectric film 128 may include a silicon oxide film, a high-k dielectric film, or a combination thereof. The high-k dielectric film may include a film (e.g., a hafnium oxide film) having a higher dielectric constant than a silicon oxide film, without being limited thereto.

The active region AC1 may include a top surface T1 and a plurality of sidewalls S1 extending in different directions from the top surface T1. The plurality of sidewalls S1 may contact or face a device isolation insulating structure 116. The active region AC1 may include an edge portion, which extends along an outline of the top surface T1 between the top surface T1 and the plurality of sidewalls S1. The edge portion of the active region AC1 may include a normal edge portion E1 in contact with the device isolation insulating structure 116 and a local round edge portion RE1 apart from the device isolation insulating structure 116. The local round edge portion RE1 may constitute a portion of the edge portion of the active region AC1. As used herein, the term "normal edge portion" refers to other portions of the edge portion, except for the local round edge portion RE1, in the top surface T1 of the active region AC1.

The local round edge portion RE1 of the active region AC1 may have a radius of curvature that is greater than that of the other portions of the edge portion of the top surface T1 of the active region AC1. In the active portion of the active region AC1, a first radius of the local round edge portion RE1 may be greater than a second radius of curvature of the normal edge portion E1. In embodiments, a radius of curvature of the local round edge portion RE1 of the active region AC1 may be at least about 20 nm. Of the edge portion of the active region AC1, a portion other than the local round edge portion RE1 may have a radius of curvature of about 8 nm or less. In embodiments, the first radius of curvature may be in a range of about 20 nm to about 50 nm, and the second radius of curvature may be in a range of about 0.1 nm to about 8 nm. In embodiments, the first radius of curvature of the local round edge portion RE1 may be in a range of about 20 nm to about 50 nm, a range of about 25 nm to about 45 nm, or a range of about 25 nm to about 40 nm. For example, the first radius of curvature of the local round edge portion RE1 may be in a range of about 30 nm to about 35 nm, without being limited thereto.

As shown in FIG. 4A, the active region AC1 may have an L-shaped planar form having a bending portion and linear extensions extending from the bending portion in a lateral direction. As used herein, the term "bending portion" may refer to a portion at which a direction in which an active region extends is changed in a view from above.

The local round edge portion RE1 of the active region AC1 may be in a local region LA1, which is a portion of the edge portion of the active region AC1. The local region LA1 may be a region including a portion of each of the bending portion and the linear extensions of the active region AC1. The local round edge portion RE1 of the active region AC1 may include a portion that extends along the edge portion of the active region AC1 in the local region LA1. The local round edge portion RE1 of the active region AC1 may be a portion of the channel region C1. A portion of an outer edge portion of the active region AC1 in the channel region C1 may include the local round edge portion RE1, while another portion thereof may include the normal edge portion E1. As used herein, the term "outer edge portion" refers to an edge portion having a greater length, out of both edge portions between the first source/drain region SD1 and the second source/drain region SD2 in the active region AC1.

As shown in FIG. 4B, in the active region AC1, the local round edge portion RE1 may be in only one of both side portions of the active region AC1 in a direction orthogonal to a channel direction formed in the channel region C1. In embodiments, as shown in FIG. 4A, the first source/drain region SD11 and the second source/drain region SD2 may be at different distances from the local round edge portion RE1 in the channel direction.

A local top surface adjacent to the local round edge portion RE1, of the top surfaces T1 of the active region AC1, and a local sidewall adjacent to the local round edge portion RE1, from among the plurality of sidewalls S1 of the active region AC1, may be at least partially covered by the gate electrode G1, and a sidewall opposite to the local sidewall may be at least partially covered by the device isolation insulating structure 116.

As shown in FIGS. 4B and 4C, the gate electrode G1 may include a lateral gate portion GH1, a vertical gate portion GV1, and a round inner corner portion GC1. The lateral gate portion GH1 may be on and at least partially cover a portion of the top surface T1 of the active region AC1 with the gate dielectric film 128 therebetween. The vertical gate portion GV1 may be on and at least partially cover one of the plurality of sidewalls S1 of the active regions AC1, which is adjacent to the local round edge portion RE1, with the gate dielectric film 128 therebetween. The round inner corner portion GC1 may be integrally connected to the lateral gate portion GH1 and the vertical gate portion GV1, for example, to form a monolithic structure, and face the local round edge portion RE1 with the gate dielectric film 128 therebetween. In embodiments, the gate electrode G1 may include doped polysilicon. For example, the gate electrode G1 may include polysilicon doped with N-type impurities, such as phosphorus (P) or arsenic (As).

As shown in FIG. 4A, in an outer edge portion of the active region AC1 in a first lateral direction (X direction) and a second lateral direction (Y direction), the gate electrode G1 may be on and at least partially cover the local round edge portion RE1 of the active region AC1 in the local region LA1 and be on and at least partially cover the normal edge portion E1 outside the local region LA5. The vertical gate portion GV1 of the gate electrode G1 may be in only a region corresponding to the local region LAL.

As shown in FIGS. 4B and 4C, the transistor TR1 may be at least partially covered by an interlayer insulating film 160. The interlayer insulating film 160 may include a silicon oxide film, without being limited thereto.

Figure 5A:
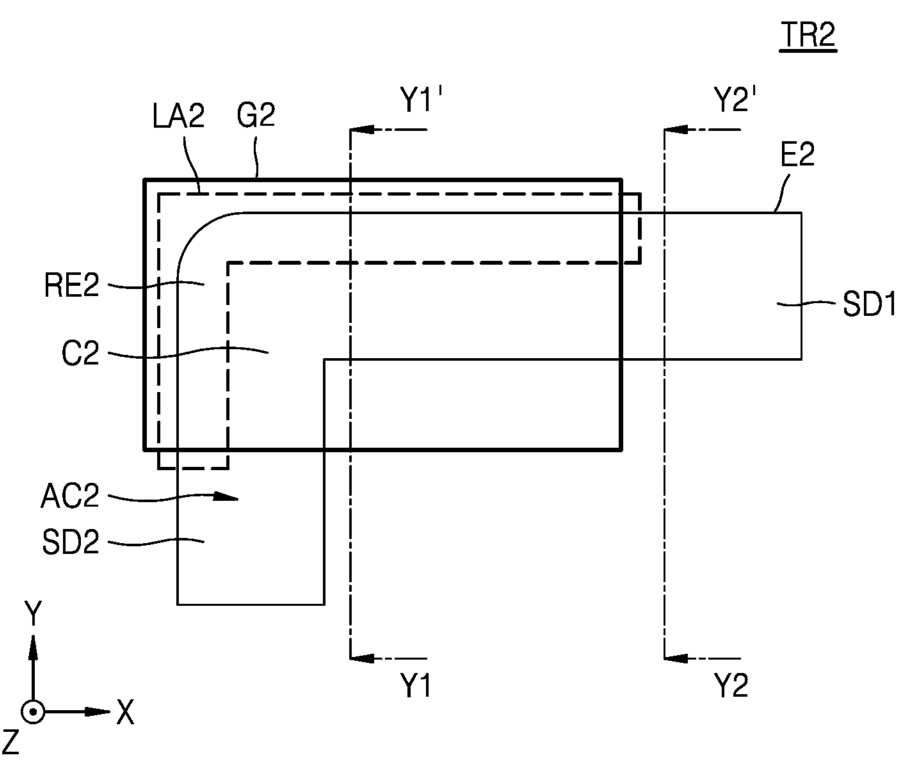
FIG. 5A is a plan layout diagram of a transistor according to embodiments.
Figure 5B:
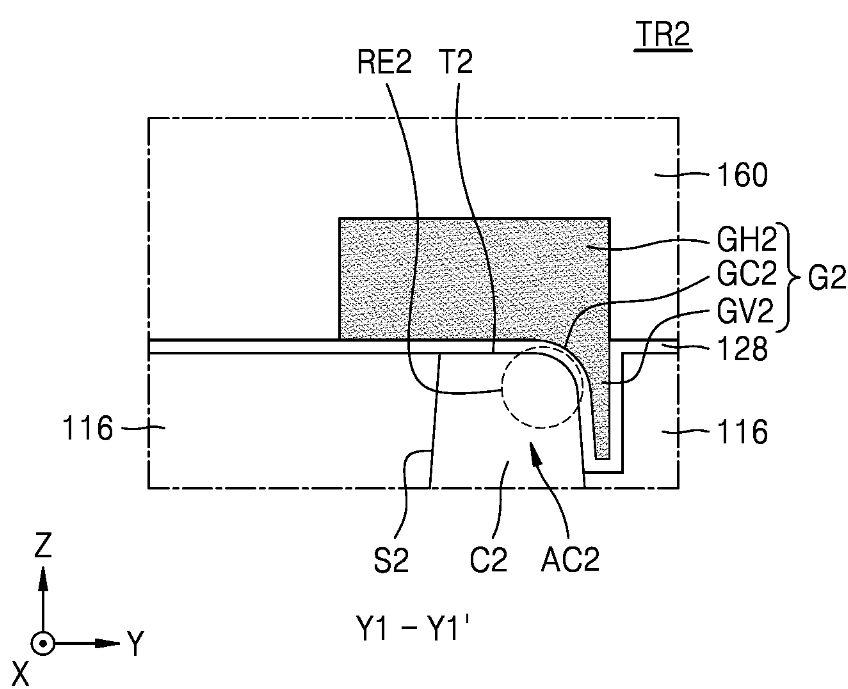
FIG. 5B is a cross-sectional view taken along line Y1-Y1' of FIG. 5A.
Figure 5C:
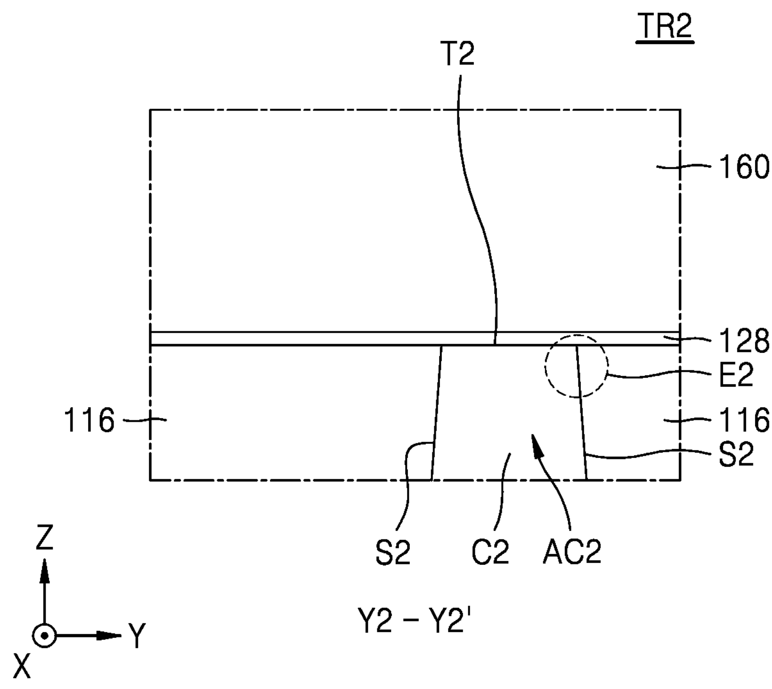
FIG. 5C is a cross-sectional view taken along line Y2-Y2' of FIG. 5A.

FIGS. 5A, 5B, and 5C are diagrams of a transistor TR2 according to embodiments. More specifically, FIG. 5A is a plan layout diagram of the transistor TR2. FIG. 5B is a cross-sectional view of an example configuration according to the cross-section taken along line Y1-Y1' of FIG. 5A. FIG. 5C is a cross-sectional view of an example configuration according to the cross-section taken along line Y2-Y2' of FIG. 5A. The transistor TR2 shown in FIGS. 5A, 5B, and 5C may constitute an image sensor according to the inventive concept. In FIGS. 5A, 5B, and 5C, the same reference numerals are used to denote the same elements as in FIGS. 4A, 4B, and 4C, and repeated descriptions thereof are omitted.

Referring to FIGS. 5A, 5B, and 5C, the transistor TR2 may substantially have the same configuration as the transistor TR1 described with reference to FIGS. 4A, 4B, and 4C. However, the transistor TR2 may include an active region AC2 and a gate electrode G2 on the active region AC2.

The active region AC2 may substantially have the same configuration as the active region AC1 described with reference to FIGS. 4A, 4B, and 4C. However, the active region AC2 may include a channel region C2 between a first source/drain region SD1 and a second source/drain region SD2. A gate dielectric film 128 may be between the active region AC2 and the gate electrode G2.

The active region AC2 may include a top surface T2 and a plurality of sidewalls S2 extending in different directions from the top surface T2. The plurality of sidewalls S2 may contact or face a device isolation insulating structure 116. The active region AC2 may include an edge portion, which extends along an outline of the top surface T2 between the top surface T2 and the plurality of sidewalls S2. The edge portion of the active region AC2 may include a normal edge portion E2 in contact with the device isolation insulating structure 116 and a local round edge portion RE2 apart from the device isolation insulating structure 116. The local round edge portion RE2 may constitute a portion of the edge portion of the active region AC2.

The local round edge portion RE2 of the active region AC2 may have a radius of curvature that is greater than that of other portions of the edge portion of the top surface T2 of the active region AC2. Details of the normal edge portion E2 and the local round edge portion RE2 of the active region AC2 may substantially be the same as those of the normal edge portion E1 and the local round edge portion RE1, which have been described with reference to FIGS. 4A, 4B, and 4C. However, the local round edge portion RE2 of the active region AC2 may be in a local region LA2, which is a portion of the edge portion of the active region AC2 as shown in FIG. 5A. The local region LA2 may include a region including the bending portion of the active region AC2 and a portion of a linear extension extending long from the bending portion toward the first source/drain region SD1. The local round edge portion RE2 of the active region AC2 may include a portion that extends along the edge portion of the active region AC2 in the local region LA2. As shown in FIG. 5A, the first source/drain region SD1 and the second source/drain region SD2 may be at substantially the same distance from the local round edge portion RE2 in a channel direction.

A local top surface adjacent to the local round edge portion RE2, of the top surfaces T2 of the active region AC2, and a local sidewall adjacent to the local round edge portion RE2, from among the plurality of sidewalls S2 of the active region AC2, may be at least partially covered by the gate electrode G2, and a sidewall opposite to the local sidewall may be at least partially covered by the device isolation insulating structure 116.

As shown in FIG. 5B, the gate electrode G2 may include a lateral gate portion GH2, a vertical gate portion GV2, and a round inner corner portion GC2. The lateral gate portion GH2 may be on and at least partially cover a portion of the top surface T2 of the active region AC2 with the gate dielectric film 128 therebetween. The vertical gate portion GV2 may be on and at least partially cover portions of the plurality of sidewalls S2, which are adjacent to the local round edge portion RE2, with the gate dielectric film 128 therebetween. The round inner corner portion GC2 may be integrally connected to the lateral gate portion GH2 and the vertical gate portion GV2, for example, to form a monolithic structure, and face the local round edge portion RE2 with the gate dielectric film 128 therebetween.

As shown in FIG. 5A, in an outer edge portion of the active region AC2 in a first lateral direction (X direction) and a second lateral direction (Y direction), the gate electrode G2 may be on and at least partially cover the local round edge portion RE1 in the local region LA2 without covering or overlapping the normal edge portion E2 outside the local region LA2 in the Z direction. Details of the gate electrode G2 may substantially be the same as those of the gate electrode G1 described with reference to FIGS. 4A, 4B, and 4C.

Figure 6:
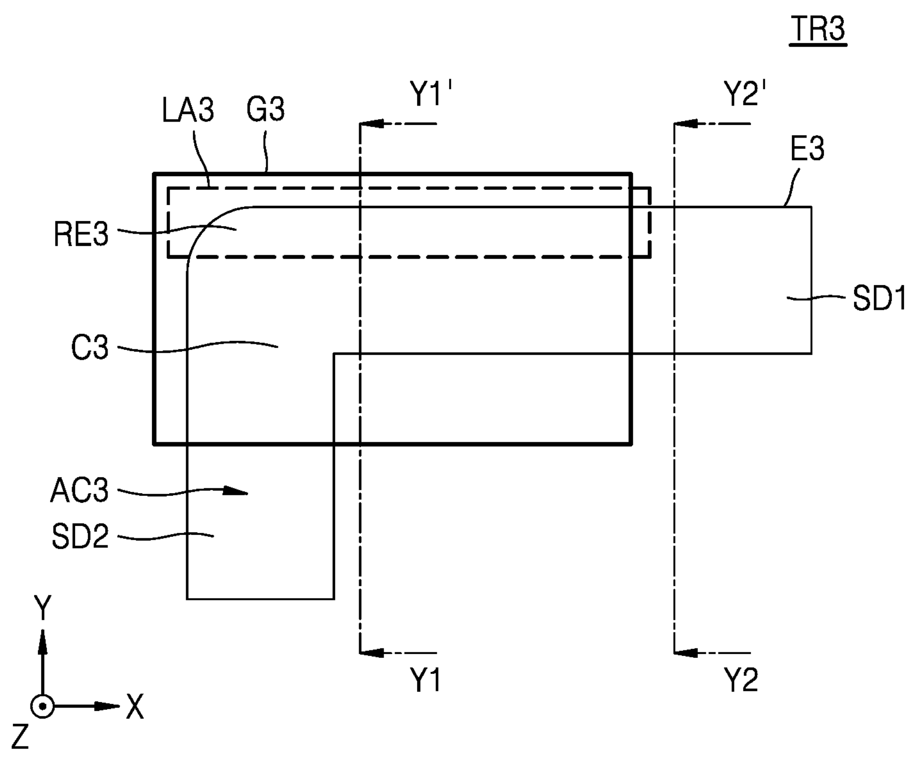
FIG. 6 is a plan layout diagram of a transistor according to embodiments.

FIG. 6 is a plan layout diagram of a transistor TR3 according to embodiments. The transistor TR3 shown in FIG. 6 may constitute an image sensor according to the inventive concept. In FIG. 6, the same reference numerals are used to denote the same elements as in FIGS. 4A, 4B, and 4C, and repeated descriptions thereof are omitted.

Referring to FIG. 6, the transistor TR3 may substantially have the same configuration as the transistor TR1 described with reference to FIGS. 4A, 4B, and 4C. However, the transistor TR3 may include an active region AC3 and a gate electrode G3 on the active region AC3.

The active region AC3 may substantially have the same configuration as the active region AC1 described with reference to FIGS. 4A, 4B, and 4C. However, the active region AC3 may include a channel region C3 between a first source/drain region SD1 and a second source/drain region SD2. The active region AC3 may include a normal edge portion E3 and a local round edge portion RE3. A portion of an outer edge portion of the active region AC3 in the channel region C3 may include the local round edge portion RE3, while another portion thereof may include the normal edge portion E3.

The local round edge portion RE3 of the active region AC3 may have a radius of curvature that is greater than that of the normal edge portion E3. Details of the normal edge portion E3 and the local round edge portion RE3 of the active region AC3 may substantially be the same as those of the normal edge portion E1 and the local round edge portion RE1, which have been described with reference to FIGS. 4A, 4B, and 4C. However, the local round edge portion RE3 of the active region AC3 may be in a local region LA3, which is a portion of the edge portion of the active region AC3. The local region LA3 may be a region including a portion of a bending portion of the active region AC3 and a portion of a linear extension extending lengthwise from the bending portion toward the first source/drain region SD1. The local round edge portion RE3 of the active region AC3 may include the bending portion of the active region AC3 and a portion extending along an edge portion of the linear extension in the local region LA3. The first source/drain region SD1 and the second source/drain region SD2 may be at different distances from the local round edge portion RE3 in a channel direction.

In the outer edge portion of the active region AC3 in a first lateral direction (X direction), the gate electrode G3 may be on and at least partially cover the local round edge portion RE3 of the active region AC3 in the local region LA3 without overlapping or covering the normal edge portion E2 outside the local region LA3 in the Z direction. In the outer edge portion of the active region AC3 in a second lateral direction (Y direction), the gate electrode G3 may at least partially cover the local round edge portion RE3 of the active region AC3 in the local region LA3 and at least partially cover the normal edge portion E2 outside the local region LA3. Details of the gate electrode G3 may substantially be the same as those of the gate electrode G1 described with reference to FIGS. 4A, 4B, and 4C. Configurations according to the cross-sections taken along lines Y1-Y1' and Y2-Y2' of FIG. 6 are substantially the same as those described with reference to FIGS. 5B and 5C, respectively.

Figure 7A:
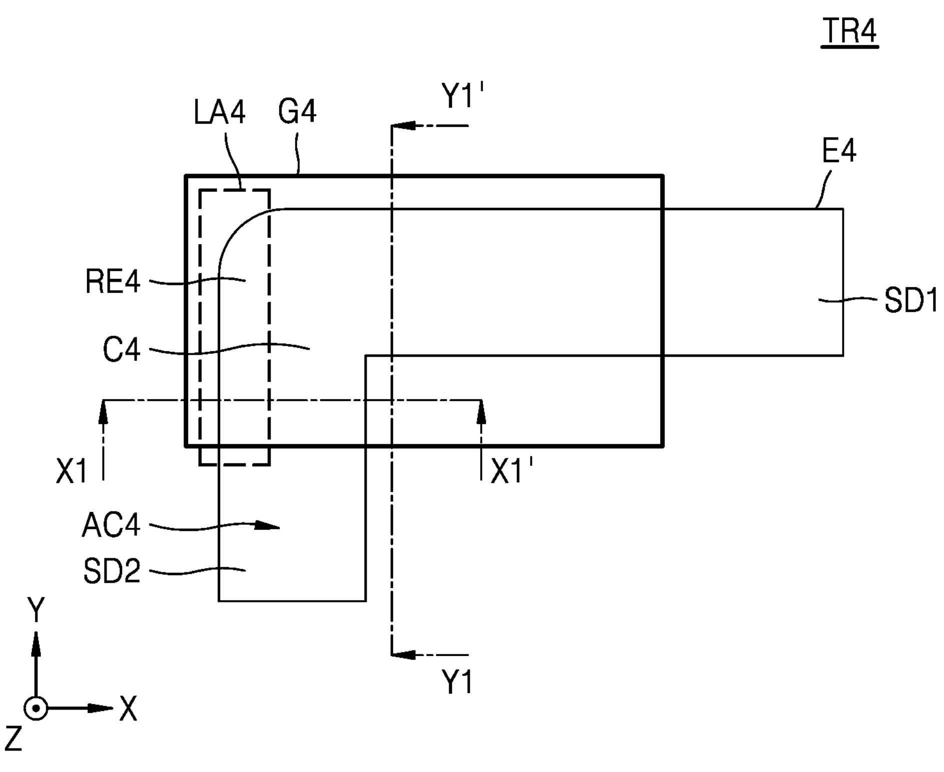
FIG. 7A is a plan layout diagram of a transistor according to embodiments.
Figure 7B:
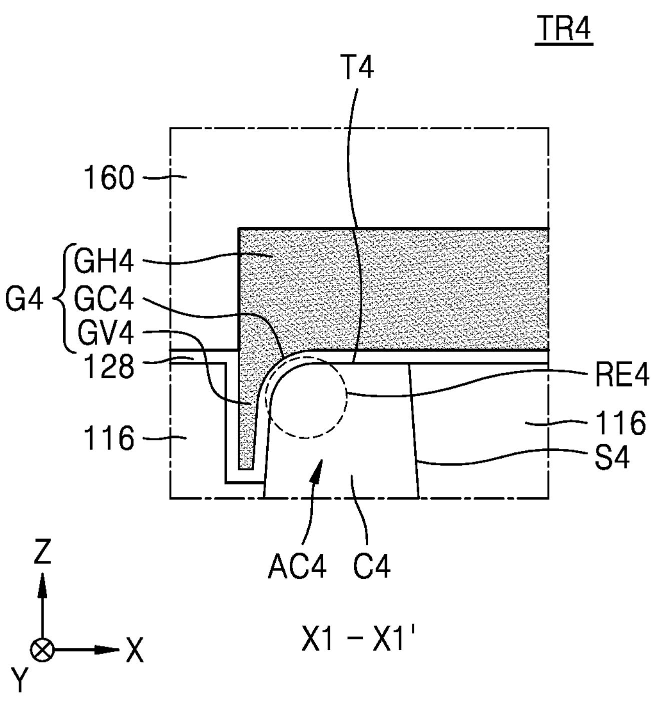
FIG. 7B is a cross-sectional view taken along line X1-X1' of FIG. 7A.
Figure 7C:
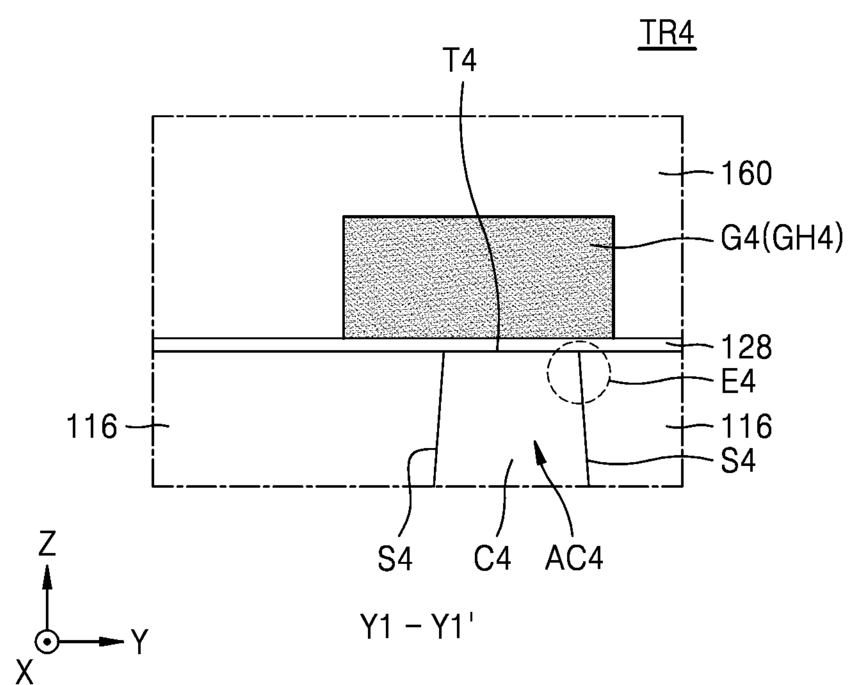
FIG. 7C is a cross-sectional view taken along line Y1-Y1' of FIG. 7A.

FIGS. 7A, 7B, and 7C are diagrams of a transistor TR4 according to embodiments. More specifically, FIG. 7A is a plan layout diagram of the transistor TR4. FIG. 7B is a cross-sectional view of an example configuration according to the cross-section taken along line X1-X1' of FIG. 7A. FIG. 7C is a cross-sectional view of an example configuration according to the cross-section taken along line Y1-Y1' of FIG. 7A. The transistor TR4 shown in FIGS. 7A, 7B, and 7C may constitute an image sensor according to the inventive concept. In FIGS. 7A, 7B, and 7C, the same reference numerals are used to denote the same elements as in FIGS. 4A, 4B, and 4C, and repeated descriptions thereof are omitted.

Referring to FIGS. 7A, 7B, and 7C, the transistor TR4 may substantially have the same configuration as the transistor TR1 described with reference to FIGS. 4A, 4B, and 4C. However, the transistor TR4 may include an active region AC4 and a gate electrode G4 on the active region AC4.

The active region AC4 may substantially have the same configuration as the active region AC1 described with reference to FIGS. 4A, 4B, and 4C. However, the active region AC4 may include a channel region C4 between a first source/drain region SD1 and a second source/drain region SD2. A gate dielectric film 128 may be between the active region AC4 and the gate electrode G4.

The active region AC4 may include a top surface T4 and a plurality of sidewalls S4 extending in different directions from the top surface T4. The plurality of sidewalls S4 may contact or face a device isolation insulating structure 116. The active region AC4 may include an edge portion, which extends along an outline of the top surface T4 between the top surface T4 and the plurality of sidewalls S4. The edge portion of the active region AC4 may include a normal edge portion E4 in contact with the device isolation insulating structure 116 and a local round edge portion RE4 apart from the device isolation insulating structure 116. The local round edge portion RE4 may constitute a portion of the edge portion of the active region AC4.

The local round edge portion RE4 of the active region AC4 may have a radius of curvature that is greater than the other portions of the edge portion of the top surface T4 of the active region AC4. Details of the normal edge portion E4 and the local round edge portion RE4 of the active region AC4 may substantially be the same as those of the normal edge portion E1 and the local round edge portion RE1, which have been described with reference to FIGS. 4A, 4B, and 4C. However, the local round edge portion RE4 of the active region AC4 may be in a local region LA4, which is a portion of the edge portion of the active region AC4 as shown in FIG. 7A. The local region LA4 may be a region including a bending portion of the active region AC4 and a linear extension extending lengthwise from the bending portion toward the second source/drain region SD2. The local round edge portion RE4 of the active region AC4 may include a portion that extends along the edge portion of the active region AC4 in the local region LA4. As shown in FIG. 7A, the first source/drain region SD1 and the second source/drain region SD2 may be at different distances from the local round edge portion RE4 in a channel direction.

A local top surface adjacent to the local round edge portion RE4, of the top surface T4 of the active region AC4, and a local sidewall adjacent to the local round edge portion RE4, from among the plurality of sidewalls S4 of the active region AC4, may be at least partially covered by the gate electrode G4, and a sidewall opposite to the local sidewall may be at least partially covered by the device isolation insulating structure 116.

As shown in FIGS. 7B and 7C, the gate electrode G4 may include a lateral gate portion GH4, a vertical gate portion GV4, and a round inner corner portion GC4. The lateral gate portion GH4 may be on and at least partially cover a portion of the top surface T4 of the active region AC4 with the gate dielectric film 128 therebetween. The vertical gate portion GV4 may be on and at least partially cover portions of the plurality of sidewalls S4 of the active region AC4, which are adjacent to the local round edge portion RE4, with the gate dielectric film 128 therebetween. The round inner corner portion GC4 may be integrally connected to the lateral gate portion GH4 and the vertical gate portion GV4, for example, to form a monolithic structure, and face the local round edge portion RE4 with the gate dielectric film 128 therebetween.

In an outer edge portion of the active region AC4 in a first lateral direction (X direction), the gate electrode G4 may be on and at least partially cover the normal edge portion E4 outside the local region LA4. In the outer edge portion of the active region AC4 in a second lateral direction (Y direction), the gate electrode G4 may be on and at least partially cover the local round edge portion RE4 of the active region AC4 in the local region LA4 without overlapping or covering the normal edge portion E4 outside the local region LA4 in the Z direction. A detailed configuration of the gate electrode G4 may be the same as that of the gate electrode G1, which has been described with reference to FIGS. 4A, 4B, and 4C.

Figure 8:
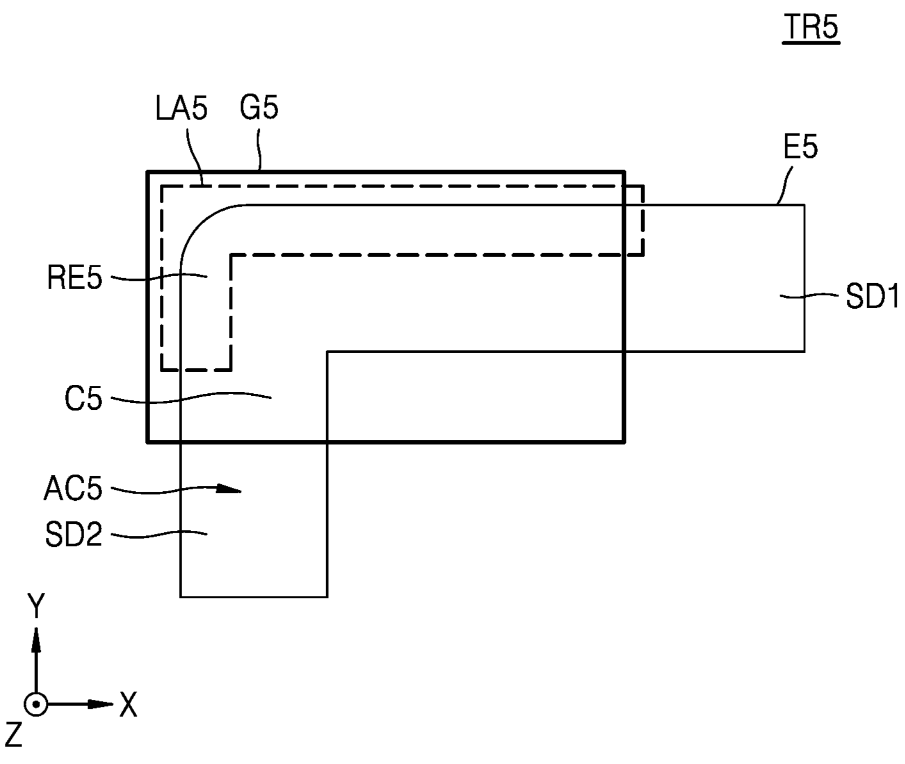
FIG. 8 is a plan layout diagram of a transistor according to embodiments.

FIG. 8 is a plan layout diagram of a transistor TR5 according to embodiments. The transistor TR5 shown in FIG. 8 may constitute an image sensor according to the inventive concept. In FIG. 8, the same reference numerals are used to denote the same elements as in FIGS. 4A, 4B, and 4C, and repeated descriptions thereof are omitted.

Referring to FIG. 8, the transistor TR5 may substantially have the same configuration as the transistor TR1 described with reference to FIGS. 4A, 4B, and 4C. However, the transistor TR5 may include an active region AC5 and a gate electrode G5 on the active region AC5.

The active region AC5 of the transistor TR5 may substantially have the same configuration as the active region AC1 described with reference to FIGS. 4A, 4B, and 4C. However, the active region AC5 of the transistor TR5 may include a channel region C5 between a first source/drain region SD1 and a second source/drain region SD2.

The active region AC5 may include a normal edge portion E5 and a local round edge portion RE5. The local round edge portion RE5 of the active region AC5 may have a radius of curvature that is greater than that of the normal edge portion E5. Details of the normal edge portion E5 and the local round edge portion RE5 of the active region AC5 may substantially be the same as those of the normal edge portion E1 and the local round edge portion RE1, which have been described with reference to FIGS. 4A, 4B, and 4C. However, the local round edge portion RE5 of the active region AC5 may be in a local region LA5, which is a portion of the edge portion of the active region AC5. The local region LA5 may be a region including a portion of a bending portion of the active region AC5 and a portion of a linear extension extending lengthwise from the bending portion toward the first source/drain region SD1. The local round edge portion RE5 of the active region AC5 may include the bending portion of the active region AC5 and a portion extending along an edge portion of the linear extension in the local region LA5. The first source/drain region SD1 and the second source/drain region SD2 may be at different distances from the local round edge portion RE3 in a channel direction.

In an outer edge portion of the active region AC5 in a first lateral direction (X direction), the gate electrode G5 may be on and at least partially cover the local round edge portion RE5 of the active region AC5 in the local region LA5 without overlapping or covering the normal edge portion E5 outside the local region LA5 in the Z direction. In the outer edge portion of the active region AC5 in a second lateral direction (Y direction), the gate electrode G5 may be on and at least partially cover the local round edge portion RE5 of the active region AC5 in the local region LA5 and be on and at least partially cover the normal edge portion E5 outside the local region LA5. Details of the gate electrode G5 may substantially be the same as those of the gate electrode G1 described with reference to FIGS. 4A, 4B, and 4C.

Figure 9:
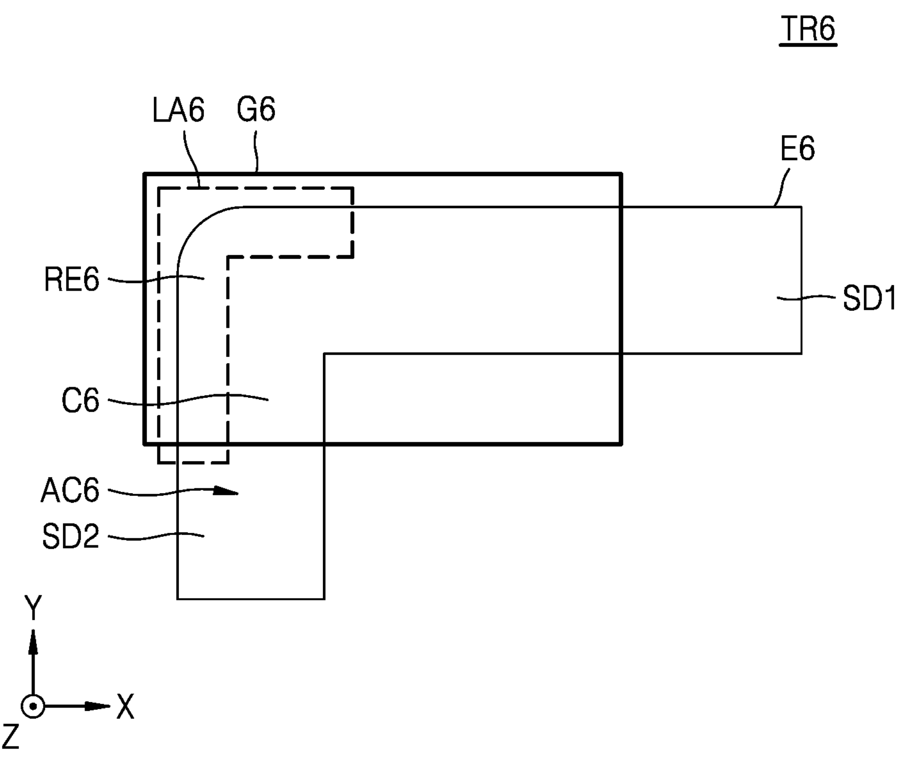
FIG. 9 is a plan layout diagram of a transistor according to embodiments.

FIG. 9 is a plan layout diagram of a transistor TR6 according to embodiments. The transistor TR6 shown in FIG. 9 may constitute an image sensor according to the inventive concept. In FIG. 9, the same reference numerals are used to denote the same elements as in FIGS. 4A, 4B, and 4C, and repeated descriptions thereof are omitted.

Referring to FIG. 9, the transistor TR6 may substantially have the same configuration as the transistor TR1 described with reference to FIGS. 4A, 4B, and 4C. However, the transistor TR6 may include an active region AC6 and a gate electrode G6 on the active region AC6.

The active region AC6 of the transistor TR6 may substantially have the same configuration as the active region AC1 described with reference to FIGS. 4A, 4B, and 4C. However, the active region AC6 of the transistor TR6 may include a channel region C6 between a first source/drain region SD1 and a second source/drain region SD2.

The active region AC6 may include a normal edge portion E6 and a local round edge portion RE6. The local round edge portion RE6 of the active region AC6 may have a radius of curvature that is greater than that of the normal edge portion E6. Details of the normal edge portion E6 and the local round edge portion RE6 of the active region AC6 may substantially be the same as those of the normal edge portion E1 and the local round edge portion RE1, which have been described with reference to FIGS. 4A, 4B, and 4C. However, the local round edge portion RE6 of the active region AC6 may be in a local region LA6, which is a portion of the edge portion of the active region AC6. The local region LA6 may be a region including a portion of a bending portion of the active region AC6 and a portion of a linear extension extending lengthwise from the bending portion toward the second source/drain region SD2. The local round edge portion RE6 of the active region AC6 may include the bending portion of the active region AC6 and a portion extending along an edge portion of the linear extension in the local region LA6. The first source/drain region SD1 and the second source/drain region SD2 may be at different distances from the local round edge portion RE6 in a channel direction.

In an outer edge portion of the active region AC6 in a first lateral direction (X direction), the gate electrode G6 may be on and at least partially cover the local round edge portion RE6 of the active region AC6 in the local region LA6 and be on and at least partially cover the normal edge portion E6 outside the local region LA6. In the outer edge portion of the active region AC6 in a second lateral direction (Y direction), the gate electrode G6 may be on and at least partially cover the local round edge portion RE6 of the active region AC6 in the local region LA6 without overlapping or covering the normal edge portion E6 outside the local region LA6 in the Z direction. Details of the gate electrode G6 may substantially be the same as those of the gate electrode G1 described with reference to FIGS. 4A, 4B, and 4C.

Figure 10:
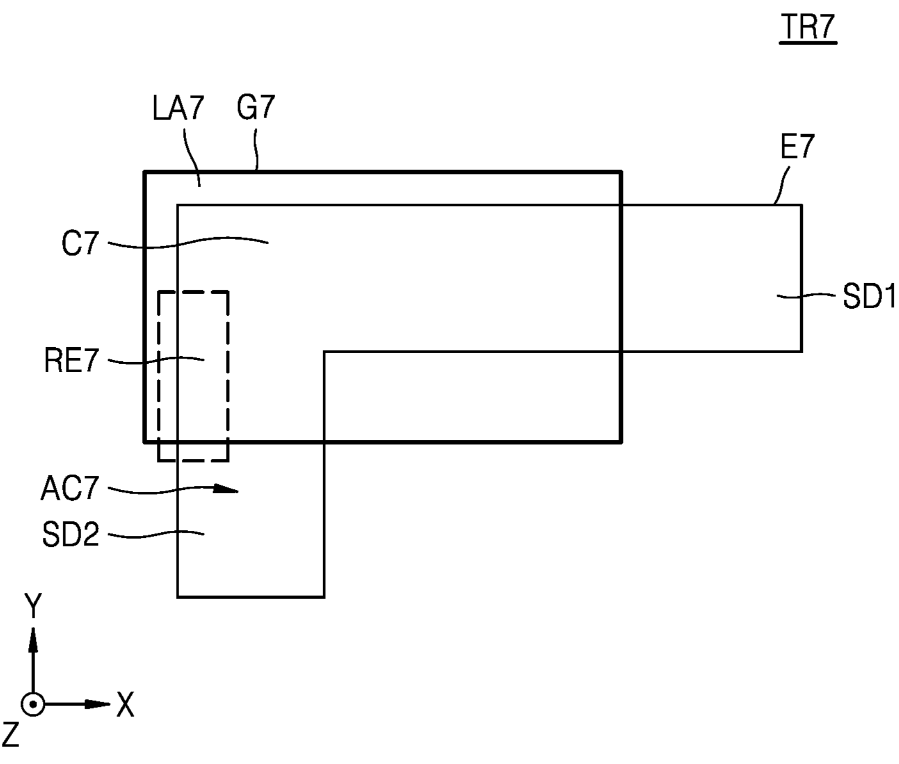
FIG. 10 is a plan layout diagram of a transistor according to embodiments.

FIG. 10 is a plan layout diagram of a transistor TR7 according to embodiments. The transistor TR7 shown in FIG. 10 may constitute an image sensor according to the inventive concept. In FIG. 10, the same reference numerals are used to denote the same elements as in FIGS. 4A, 4B, and 4C, and repeated descriptions thereof are omitted.

Referring to FIG. 10, the transistor TR7 may substantially have the same configuration as the transistor TR1 described with reference to FIGS. 4A, 4B, and 4C. However, the transistor TR7 may include an active region AC7 and a gate electrode G7 on the active region AC7.

The active region AC7 of the transistor TR7 may substantially have the same configuration as the active region AC1 described with reference to FIGS. 4A, 4B, and 4C. However, the active region AC7 of the transistor TR7 may include a channel region C7 between a first source/drain region SD1 and a second source/drain region SD2.

The active region AC7 may include a normal edge portion E7 and a local round edge portion RE7. The local round edge portion RE7 of the active region AC7 may have a radius of curvature that is greater than that of the normal edge portion E7. Details of the normal edge portion E7 and the local round edge portion RE7 of the active region AC7 may substantially be the same as those of the normal edge portion E1 and the local round edge portion RE1, which have been described with reference to FIGS. 4A, 4B, and 4C. However, the local round edge portion RE7 of the active region AC7 may be in a local region LA7, which is a portion of the edge portion of the active region AC7. The local region LA7 may not include a bending portion of the active region AC7 but may be a region including only a portion of a linear extension extending lengthwise from the bending portion toward the second source/drain region SD2. The bending portion of the active region AC7 may include the normal edge portion E7 but may not include the local round edge portion RE7.

The local round edge portion RE7 of the active region AC7 may include a portion extending along an edge portion of the linear extension of the active region AC7 in the local region LA7. The first source/drain region SD1 and the second source/drain region SD2 may be at different distances from the local round edge portion RE7 in a channel direction.

In an outer edge portion of the active region AC7 in a first lateral direction (X direction), the gate electrode G7 may be on and at least partially cover the normal edge portion E7 outside the local region LA7. In an outer edge portion of the active region AC7 in a second lateral direction (Y direction), the gate electrode G7 may be on and at least partially cover the local round edge portion RE7 of the active region AC7 in the local region LA7 and be on and at least partially cover the normal edge portion E7 in the bending portion outside the local region LA7. Details of the gate electrode G7 may substantially be the same as those of the gate electrode G1 described with reference to FIGS. 4A, 4B, and 4C.

Figure 11A:
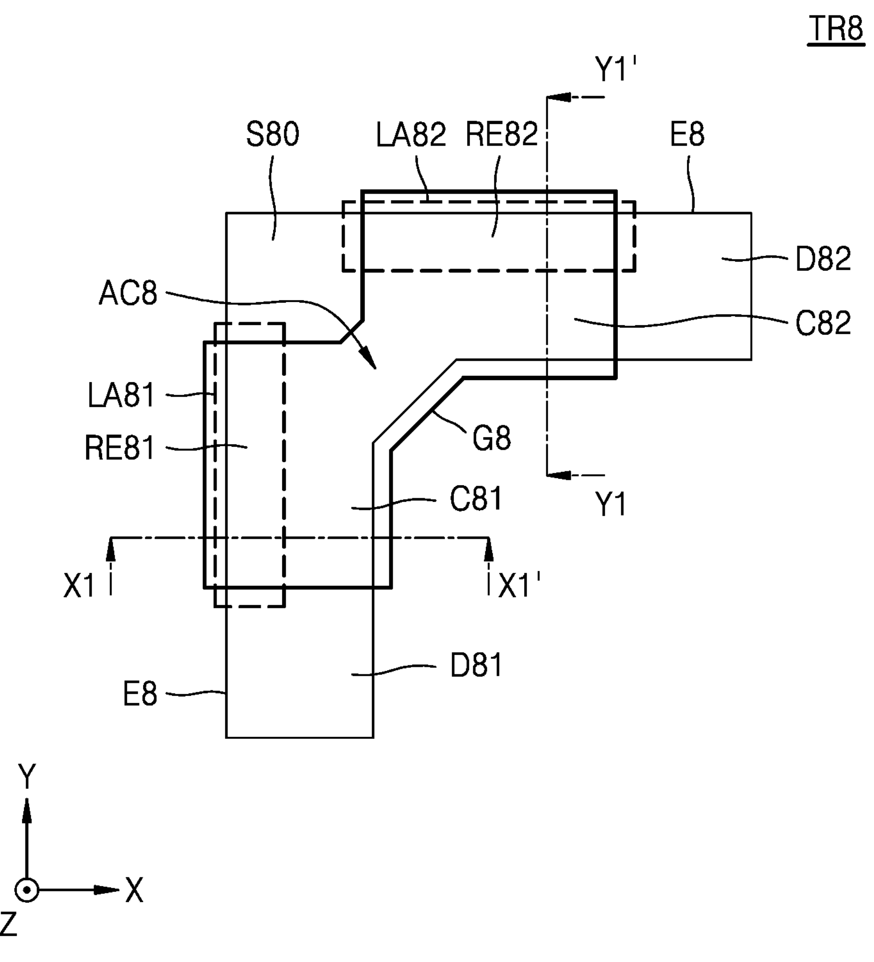
FIG. 11A is a plan layout diagram of a transistor according to embodiments.
Figure 11B:
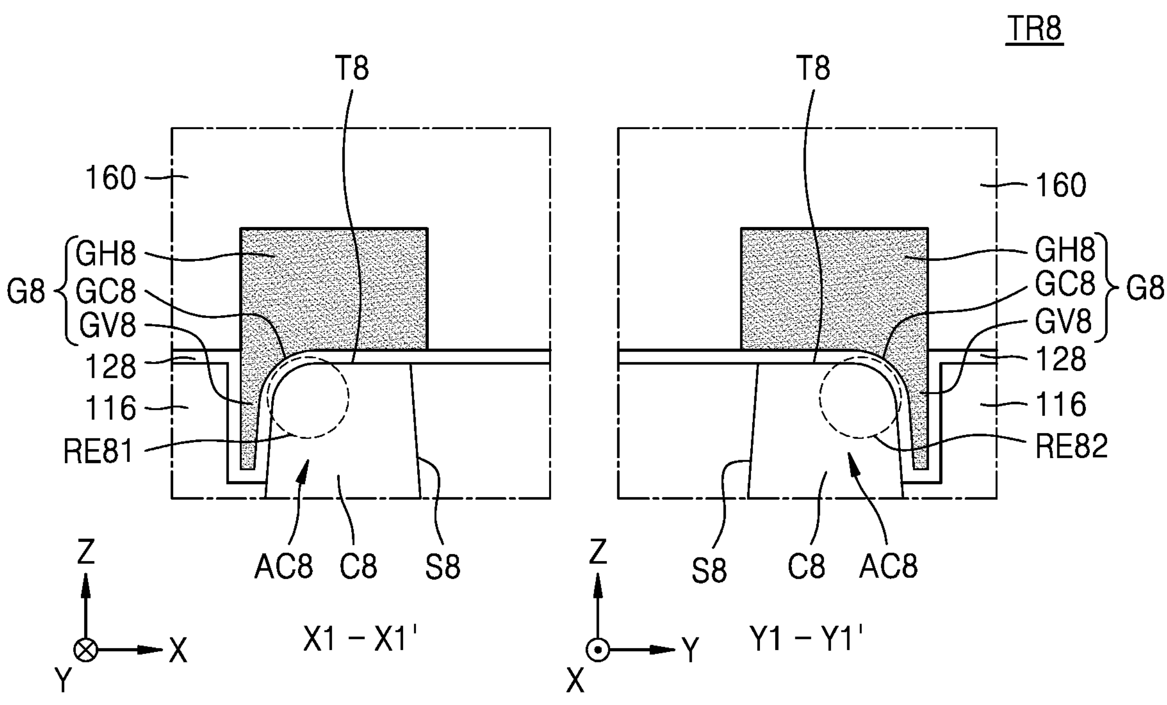
FIG. 11B is a cross-sectional view taken along lines X1-X1' and Y1-Y1' of FIG. 11A.

FIGS. 11A and 11B are diagrams of a transistor TR8 according to embodiments. More specifically, FIG. 11A is a plan layout diagram of the transistor TR8. FIG. 11B is a cross-sectional view of an example configuration according to a cross-section taken along lines X1-X1' and Y1-Y1' of FIG. 11A. The transistor TR8 shown in FIGS. 11A and 11B may constitute an image sensor according to the inventive concept. In FIGS. 11A and 11B, the same reference numerals are used to denote the same elements as in FIGS. 4A, 4B, and 4C, and repeated descriptions thereof are omitted.

Referring to FIGS. 11A and 11B, the transistor TR8 may include a dual transistor in which two local transistors configured to share one source region S80 therebetween are connected in parallel to each other. The transistor TR8 may include an active region AC8 and a gate electrode G8 on the active region AC8.

In a view from above (or in an X-Y plane), the active region AC8 may have a substantially L-shaped planar form including a bending portion. The source region S80 may be in the bending portion of the active region AC8, a first drain region D81 may be at one end of the active region AC8, and a second drain region D82 may be at another end of the active region AC8. In the active region AC8, a first channel region C81 may be between the source region S80 and the first drain region D81, and a second channel region C82 may be between the source region S80 and the second drain region D82. A gate dielectric film 128 may be between the active region AC8 and the gate electrode G8.

The active region AC8 may include a top surface T8 and a plurality of sidewalls S8 extending in different directions from the top surface T8. The plurality of sidewalls S8 may contact or face a device isolation insulating structure 116. The active region AC8 may include an edge portion that extends along an outline of the top surface T8 between the top surface T8 and the plurality of sidewalls S8. The edge portion of the active region AC8 may include a normal edge portion E8, which is in contact with the device isolation insulating structure 116, and a first local round edge portion RE81 and a second local round edge portion RE82, which are apart from the device isolation insulating structure 116. Each of the first local round edge portion RE81 and the second local round edge portion RE82 may constitute a portion of the edge portion of the active region AC8.

Each of the first local round edge portion RE81 and the second local round edge portion RE82 of the active region AC8 may have a radius of curvature that is greater than that of another portion of the edge portion of the top surface T8 of the active region AC8. Details of the normal edge portion E8 of the active region AC8 may substantially be the same as those of the normal edge portion E1, which have been described with reference to FIGS. 4A, 4B, and 4C. Details of the first local round edge portion RE81 and the second local round edge portion RE82 of the active region AC8 may substantially be the same as that of the local round edge portion RE1, which has been described with reference to FIGS. 4A, 4B, and 4C. However, as shown in FIG. 11A, the first local round edge portion RE81 of the active region AC8 may be in a first local region LA81, which is a portion of the edge portion of the active region AC8, and the second local round edge portion RE82 of the active region AC8 may be in a second local region LA82, which is another portion of the edge portion of the active region AC8. The first local region LA81 may be a region including a portion of a linear extension, which extends lengthwise from the bending portion toward the first drain region D81, at a position outside the bending portion of the active region AC8. The second local region LA82 may be a region including a portion of the linear extension, which extends lengthwise from the bending portion toward the second drain region D82, at a position outside the bending portion of the active region AC8.

As shown in FIG. 11B, the gate electrode G8 may include a lateral gate portion GH8, a pair of vertical gate portions GV8, and a pair of round inner corner portions GC8. The lateral gate portion GH8 may be on and at least partially cover a portion of the top surface T8 of the active region AC8 with the gate dielectric film 128 therebetween. Each of the pair of vertical gate portions GV8 may be on and at least partially cover one of the plurality of sidewalls S8 of the active region AC8, which is adjacent to a selected one of the first local round edge portion RE81 and the second local round edge portion RE82, with the gate dielectric film 128 therebetween. The pair of round inner corner portions GC8 may be integrally connected to the lateral gate portion GH8 and the pair of vertical gate portions GV8, for example, to form a monolithic structure, and face the first local round edge portion RE81 and the second local round edge portion RE82 with the gate dielectric film 128 therebetween.

As shown in FIG. 11A, in an outer edge portion of the active region AC8 in a second lateral direction (Y direction), the gate electrode G8 may be on and at least partially cover the first local round edge portion RE81 of the active region AC8 in the first local region LA81. In an outer edge portion of the active region AC8 in a first lateral direction (X direction), the gate electrode G8 may be on and at least partially cover the second local round edge portion RE82 of the active region AC8 in the second local region LA82. A detailed configuration of the gate electrode G8 may be the same as that of the gate electrode G1, which has been described with reference to FIGS. 4A, 4B, and 4C.

Figure 12A:
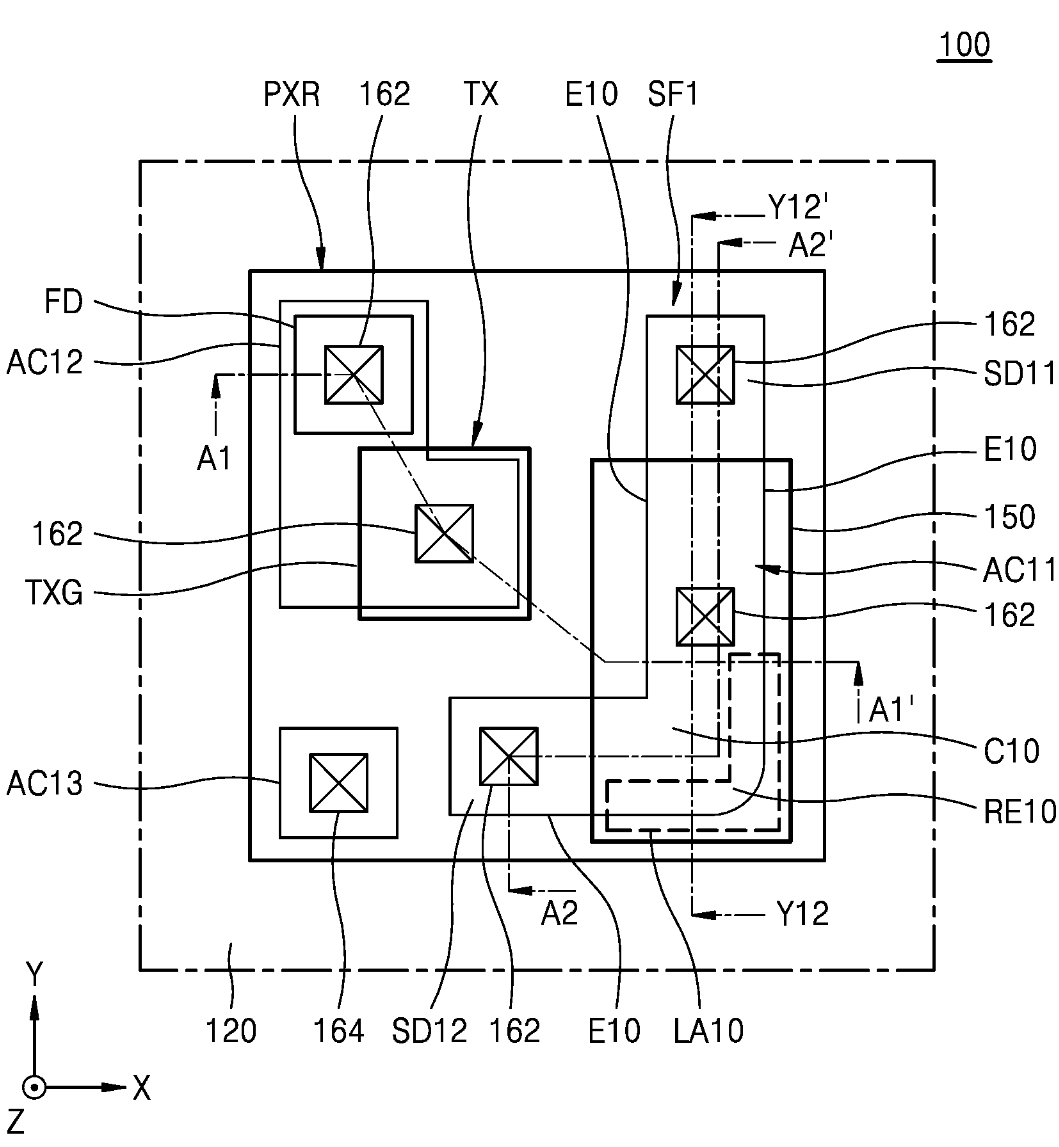
FIG. 12A is a plan layout diagram of an example structure of a pixel region included in an image sensor according to embodiments.
Figure 12B:
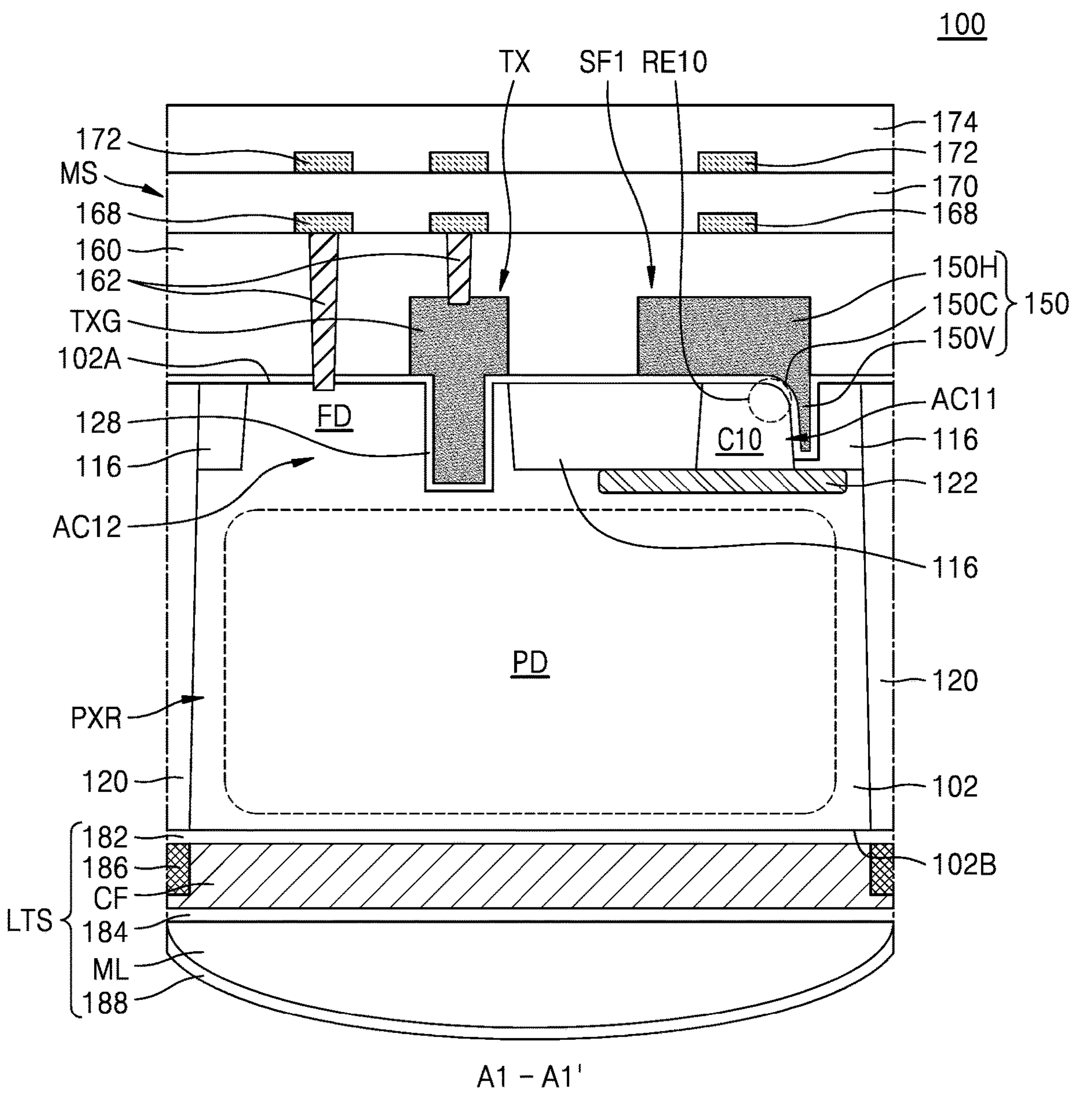
FIG. 12B is a cross-sectional view taken along line A1-A1' of FIG. 12A.
Figure 12C:
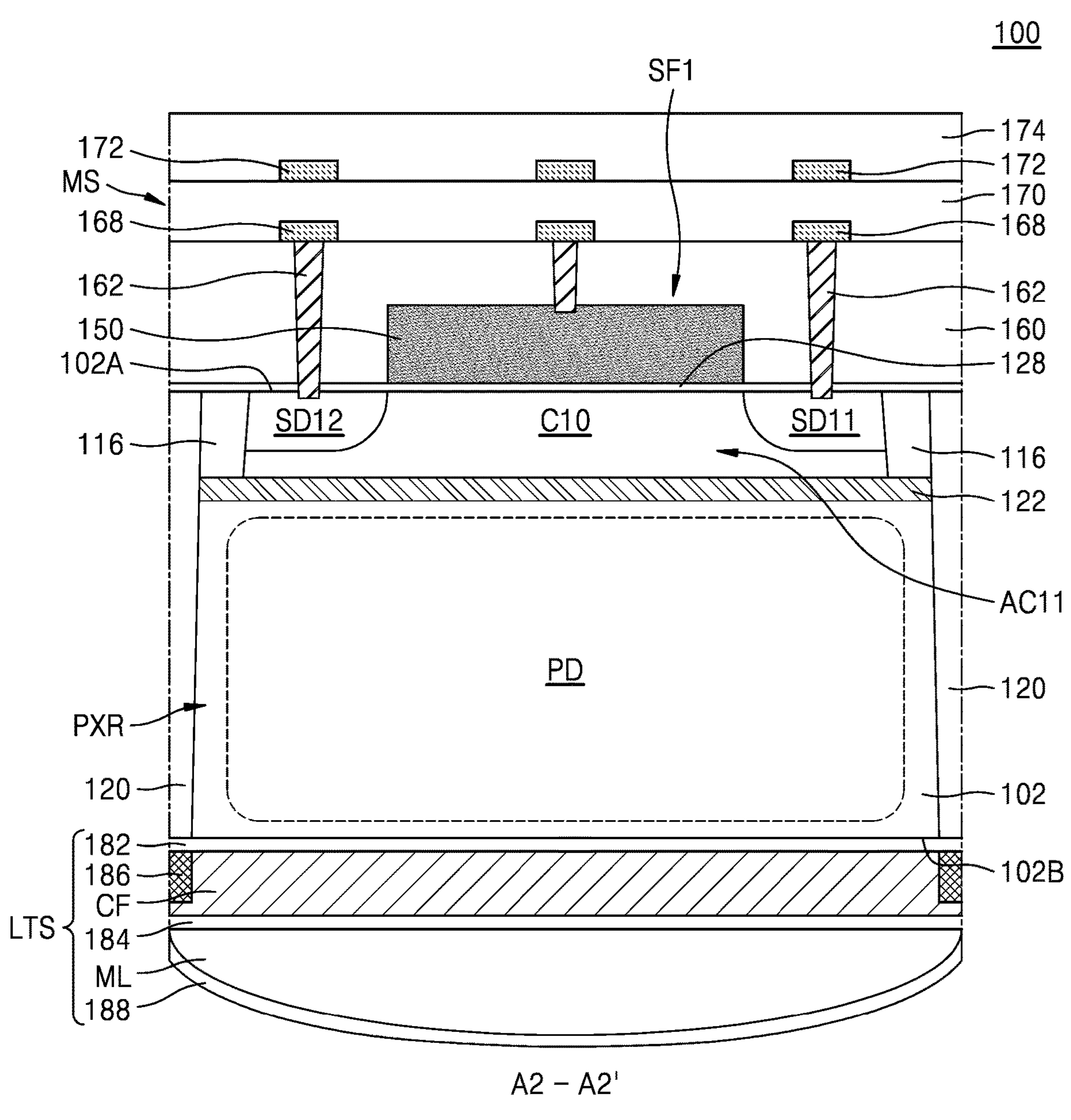
FIG. 12C is a cross-sectional view taken along line A2-A2' of FIG. 12A.
Figure 12D:
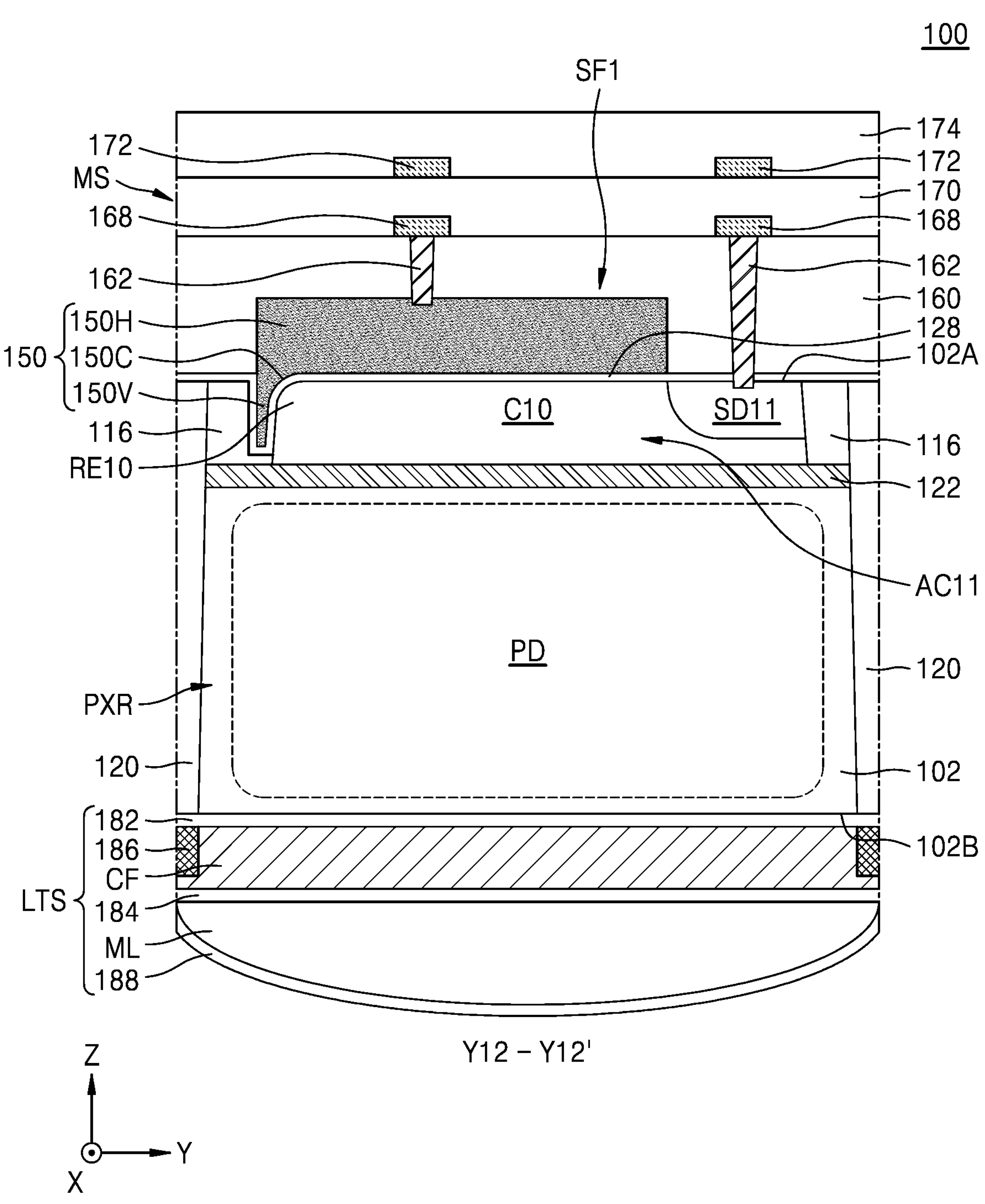
FIG. 12D is a cross-sectional view taken along line Y12-Y12' of FIG. 12A.

FIGS. 12A to 12D are diagrams of an image sensor 100 according to embodiments. More specifically, FIG. 12A is a plan layout diagram of an example structure of a pixel region PXR included in the image sensor 100. FIG. 12B is a cross-sectional view of an example configuration according to the cross-section taken along line A1-A1' of FIG. 12A. FIG. 12C is a cross-sectional view of an example configuration according to the cross-section taken along line A2-A2' of FIG. 12A. FIG. 12D is a cross-sectional view of an example configuration according to the cross-section taken along line Y12-Y12' of FIG. 12A.

Referring to FIGS. 12A to 12D, the image sensor 100 may include a substrate 102 having the pixel region PXR. Although one pixel region PXR is illustrated in FIG. 12A, the substrate 102 may include a plurality of pixel regions PXR.

The pixel region PXR may be defined by a pixel isolation insulating film 120 in the substrate 102. The pixel region PXR may include a photodiode PD formed in the substrate 102. The pixel region PXR may be a region configured to sense light incident from the outside. In embodiments, the photodiode PD may be any one of the first and second photodiodes PD1 and PD2 shown in FIG. 2 or any one of the first to fourth photodiodes PD1, PD2, PD3, and PD4 shown in FIG. 3.

The substrate 102 may include a semiconductor layer. In embodiments, the substrate 102 may include a semiconductor layer doped with P-type impurities. For example, the substrate 102 may include a semiconductor layer including S1, Ge, SiGe, a group II-VI compound semiconductor, a group III-V compound semiconductor, or a combination thereof, or a silicon on insulator (SOI) substrate. In embodiments, the substrate 102 may include a P-type epitaxial semiconductor layer epitaxially grown from a P-type bulk silicon substrate. The substrate 102 may have a front side surface 102A and a back side surface 102B that are opposite surfaces.

The pixel isolation insulating film 120 may have a planar structure bordering or surrounding the photodiode PD in a plan view. The pixel isolation insulating film 120 may extend lengthwise from the front side surface 102A of the substrate 102 to the back side surface 102B of the substrate 102 in a thickness direction of the substrate 102. In embodiments, the pixel isolation insulating film 120 may include silicon oxide, silicon nitride, silicon carbonitride (SiCN), silicon oxynitride (SiON), silicon oxycarbide (SiOC), polysilicon, a metal, a metal nitride, a metal oxide, borosilicate glass (BSG), phosphosilicate glass (PSG), borophosphosilicate glass (BPSG), plasma enhanced tetraethyl orthosilicate (PE-TEOS), fluoride silicate glass (FSG), carbon doped silicon oxide (CDO), organosilicate glass (OSG), air, or a combination thereof. Herein, the term "air" may refer to other gases that may be in the atmosphere or during a manufacturing process. For example, tungsten (W), copper (Cu), or a combination thereof may be provided as a metal that may be included in the pixel isolation insulating film 120. A metal nitride that may be included in the pixel isolation insulating film 120 may include titanium nitride (TiN), tantalum nitride (TaN), or a combination thereof. A metal oxide that may be included in the pixel isolation insulating film 120 may include indium tin oxide (ITO), aluminum oxide ($Al_2O_3$), or a combination thereof.

A plurality of transistors and a wiring structure MS may be on the front side surface 102A of the substrate 102. In embodiments, the plurality of transistors may include the first and second transfer transistors TX1 and TX2, the reset transistor RX, the source follower transistor SF, and the selection transistor SX, which have been described with reference to FIG. 2. In other embodiments, the plurality of transistors may include the first to fourth transfer transistors TX1, TX2, TX3, and TX4, the reset transistor RX, the source follower transistor SF, and the selection transistor SX, which have been described with reference to FIG. 3. A source follower transistor SF1 and a transfer transistor TX may be in the pixel region PXR shown in FIG. 12A. The source follower transistor SF1 may correspond to the source follower transistor SF shown in FIG. 2 or the source follower transistor SF shown in FIG. 3.

In the pixel region PXR shown in FIG. 12A, a plurality of active regions (e.g., AC11, AC12, and AC13) may be defined by a device isolation insulating structure 116. The plurality of active regions (e.g., AC11, AC12, and AC13) may include a first active region AC11, a second active region AC12, and a third active region AC13. In embodiments, the device isolation insulating structure 116 may include an insulating film, which includes a silicon oxide film, a silicon nitride film, or a combination thereof. In other embodiments, the device isolation insulating structure 116 may be a region heavily doped with P-type impurities.

The first active region AC11 may substantially have the same configuration as those of the active region AC1, which have been described with reference to FIGS. 4A, 4B, and 4C. The first active region AC11 may include a normal edge portion E10 in contact with the device isolation insulating structure 116 and a local round edge portion RE10 apart from the device isolation insulating structure 116. The local round edge portion RE10 may constitute a portion of an edge portion of the first active region AC11, which extends along an outline of a top surface of the first active region AC11. The local round edge portion RE10 of the first active region AC11 may have a radius of curvature that is greater than that of another portion of the edge portion of the top surface of the first active region AC11. In the edge portion of the first active region AC11, a first radius of curvature of the local round edge portion RE10 may be greater than a second radius of the normal edge portion E10. In embodiments, the first radius of curvature may be in a range of about 20 nm to about 50 nm, and the second radius of curvature may be in a range of about 0.1 nm to about 8 nm, without being limited thereto.

As shown in FIG. 11A, in a plan view from above (or looking down on the X-Y plane), the first active region AC11 may have an L-shaped planar form including a bending portion. The local round edge portion RE10 may be in a local region LA10, which is a portion of the edge portion of the first active region AC11. The local region LA10 may be a region including the bending portion of the first active region AC11. The local round edge portion RE10 may be in the bending portion of the first active region AC11. Details of the local round edge portion RE10 may substantially be the same as those of the local round edge portion RE1, which have been described with reference to FIGS. 4A, 4B, and 4C.

In the pixel region PXR, the source follower transistor SF1 may include the first active region AC11 and a gate electrode 150 on and at least partially covering a portion of the first active region AC11. The source follower transistor SF1 may include a first source/drain region SD11 and a second source/drain region SD12 and a channel region C10. The first source/drain region SD11 and the second source/drain region SD12 may be formed in the first active region AC11 on both sides of the gate electrode 150 and apart from each other with the local round edge portion RE10 therebetween. The channel region C10 may be between the first source/drain region SD11 and the second source/drain region SD12. The first source/drain region SD11 may be at one end of the first active region AC11, and the second source/drain region SD12 may be at another end of the first active region AC11.

The local round edge portion RE10 of the first active region AC11 may include a portion that extends along the edge portion of the first active region AC11 in the local region LA10. In the first active region AC11, the local round edge portion RE10 may be in only one of both side portions of the first active region AC11 in a direction orthogonal to a channel direction formed in the first active region AC11. The first source/drain region SD11 and the second source/drain region SD12 may be at different distances from the local round edge portion RE10 in a channel direction.

The gate electrode 150 may include a lateral gate portion 150H, a vertical gate portion 150V, and a round inner corner portion 150C, which are integrally connected to each other, for example, to form a monolithic structure. The lateral gate portion 150H of the gate electrode 150 may be on and at least partially cover a portion of the top surface of the first active region AC11. The vertical gate portion 150V of the gate electrode 150 may be on and at least partially cover a local sidewall, which is a portion of one of a plurality of sidewalls of the first active region AC11, which is adjacent to the local round edge portion RE10. The vertical gate portion 150V may be between the local round edge portion RE10 of the first active region AC11 and the device isolation insulating structure 116. In the first active region AC11, a sidewall opposite to the local sidewall covered by the vertical gate portion 150V may be at least partially covered by the device isolation insulating structure 116. The round inner corner portion 150C may be integrally connected to the lateral gate portion 150H and the vertical gate portion 150V, for example, to form a monolithic structure, and face the local round edge portion RE10.

A gate dielectric film 128 may be between the first active region AC11 and the gate electrode 150. A gate dielectric film 128 may be between the first active region AC11 and the vertical gate portion 150V and between the vertical gate portion 150V and the device isolation insulating structure 116. A bottom surface of the vertical gate portion 150V of the gate electrode 150 may be at a lower vertical level (Z direction) than the front side surface 102A of the substrate 102. In embodiments, the gate electrode 150 may include doped polysilicon. For example, the gate electrode 150 may include polysilicon doped with N-type impurities, such as phosphorus (P) or arsenic (As).

A top surface of the lateral gate portion 150H of the gate electrode 150 may be at least partially covered by an insulating capping pattern (not shown). Sidewalls of the lateral gate portion 150H may be at least partially covered by insulating spacers (not shown). Each of the insulating capping pattern and the insulating spacers may include a silicon oxide film, a silicon nitride film, a silicon oxynitride film, or a combination thereof. A contact plug 162 may be connected to the top surface of the lateral gate portion 150H of the gate electrode 150.

In the first active region AC11, the first source/drain region SD11 and the second source/drain region SD12 may be at different distances from the local round edge portion RE10 in a channel direction formed in the channel region C10 of the first active region AC11. In an example, as shown in FIG. 12A, a distance from the local round edge portion RE10 to the first source/drain region SD11 may be greater than a distance from the local round edge portion RE10 to the second source/drain region SD12 in the channel direction formed in the channel region C10 of the first active region AC11. In another example, different from that shown in FIG. 12A, the distance from the local round edge portion RE10 to the first source/drain region SD11 may be less than the distance from the local round edge portion RE10 to the second source/drain region SD12 in the channel direction formed in the channel region C10 of the first active region AC11. However, embodiments of the inventive concept are not limited thereto. For example, the first source/drain region SD11 and the second source/drain region SD12 may be at substantially the same distance from the local round edge portion RE10 in the channel direction formed in the channel region C10 of the first active region AC11.

As shown in FIGS. 12B and 12D, each of the local round edge portion RE10 of the first active region AC11 and the vertical gate portion 150V of the gate electrode 150 may overlap the photodiode PD in a vertical direction (Z direction). A barrier region 122 may be between the first active region AC11 and the photodiode PD. The barrier region 122 may be a region heavily doped with P-type impurities. The barrier region 122 may serve as a barrier configured to prevent electrons from migrating between the photodiode PD and the first active region AC11.

As shown in FIGS. 12A and 12B, a transfer transistor TX may be on the second active region AC12. The transfer transistor TX may include a gate electrode TXG. As shown in FIG. 12B, a portion of the gate electrode TXG may be buried in the substrate 102. In the transfer transistor TX, a recess channel may be formed along a recess surface of the second active region AC12 surrounding the portion of the gate electrode TXG, which is buried in the substrate 102. The contact plug 162 may be connected to a top surface of the gate electrode TXG. The transfer transistor TX may constitute any one of the first and second transfer transistors TX1 and TX2 described with reference to FIG. 2 or any one of the first to fourth the transfer transistors TX1, TX2, TX3, and TX4 described with reference to FIG. 3.

As shown in FIGS. 12A and 12B, a floating diffusion region FD may be on one side of the transfer transistor TX in the second active region AC12. The contact plug 162 may be connected to the floating diffusion region FD.

As shown in FIG. 12A, the third active region AC13 may include an impurity region (not shown), and a contact plug 164 may be connected to the impurity region of the third active region AC13. The impurity region of the third active region AC13 may be a ground region, and the contact plug 164 connected to the impurity region may be a ground contact plug.

The plurality of transistors including the source follower transistor SF1 and the transfer transistor TX may be at least partially covered by an interlayer insulating film 160 on the front side surface 102A of the substrate 102. An electrical signal converted by the photodiode PD may be signal-processed by the plurality of transistors and a wiring structure MS, which are on the front side surface 102A of the substrate 102. The wiring structure MS may include a plurality of contact plugs 162, which are selectively connected to the plurality of transistors including the source follower transistor SF1 and the transfer transistor TX, a plurality of conductive lines 168 and 172, which are selectively connected to the plurality of transistors through the contact plugs 162, and a plurality of interlayer insulating films 170 and 174 at least partially covering the plurality of conductive lines 168 and 172. In embodiments, the gate electrode 150 of the source follower transistor SF1 and the floating diffusion region FD may be electrically connectable to each other through the plurality of contact plugs 162 and the conductive line 168.

The plurality of contact plugs 162 and 164 and the plurality of conductive lines 168 and 172 may each include a metal, a conductive metal nitride, or a combination thereof. For instance, the plurality of contact plugs 162 and 164 and the plurality conductive lines 168 and 172 may each include copper (Cu), aluminum (A1), tungsten (W), titanium (Ti), molybdenum (Mo), tantalum (Ta), titanium nitride (TiN), tantalum nitride (TaN), zirconium nitride (ZrN), tungsten nitride (WN), or a combination thereof, without being limited thereto. The plurality of interlayer insulating films 160, 170, and 174 may each include an oxide film, a nitride film, or a combination thereof.

The number and arrangement of the interlayer insulating films 160, 170, and 174 and the number and arrangement of the plurality of conductive lines 168 and 172 are not limited to those illustrated in FIGS. 12B to 12D, and various changes and modifications may be made in accordance with different embodiments of the inventive concept. The plurality of conductive lines 168 and 172 in the wiring structure MS may include wirings connected to a plurality of transistors electrically connected to the photodiode PD formed in the pixel region PXR. The plurality of transistors may include the first and second transfer transistors TX1 and TX2, the reset transistor RX, the source follower transistor SF, and the selection transistor SX, which are described with reference to FIG. 2, or include the first to fourth transfer transistors TX1, TX2, TX3, and TX4, the reset transistor RX, the source follower transistor SF, and the selection transistor SX, which are described with reference to FIG. 3. In embodiments, the reset transistor RX may be arranged in a row direction or a column direction around the plurality of pixel regions PXR. Electrical signals converted by the photodiode PD may be signal-processed by the wiring structure MS. The arrangement of the plurality of conductive lines 168 and 172 may be freely changed irrespective of the arrangement of the photodiode PD.

As shown in FIGS. 12B to 12D, a light-transmitting structure LTS may be arranged on the back side surface 102B of the substrate 102. The light-transmitting structure LTS may include a first planarization film 182, a color filter CF, a second planarization film 184, a microlens ML, and a protective capping film 188 sequentially stacked on the back side surface 102B. The microlens ML may be protected by the protective capping film 188. The light-transmitting structure LTS may condense and filter light incident from the outside and provide the condensed and filtered light to the pixel region PXR. The microlens ML may have an outwardly convex shape to condense light incident on the photodiode PD. The pixel region PXR may have a back side illumination (BSI) structure that receives light from the back side surface 102B of the substrate 102.

In the light-transmitting structure LTS, the first planarization film 182 may be used as a buffer film to reduce or prevent damage to the substrate 102 during a process of manufacturing the image sensor 100. The first planarization film 182 and the second planarization film 184 may each include a silicon oxide film, a silicon nitride film, a resin, or a combination thereof, but embodiments are not limited thereto.

In embodiments, the color filter CF may include a red color filter, a green color filter, a blue color filter, or a white color filter. The white color filter may be a transparent color filter that transmits light in a visible wavelength band. In embodiments, the pixel array 10 illustrated in FIG. 1 may include a plurality of color filter groups in which a red color filter, a green color filter, a blue color filter, and a white color filter are arranged in a two-dimensional array of 2×2 to form one color filter group. The plurality of color filter groups may be arranged in a matrix form along a plurality of row lines and a plurality of column lines. In other embodiments, the color filter CF may have another color such as cyan, magenta, or yellow.

The light-transmitting structure LTS may further include an anti-reflection film 186 formed on the first planarization film 182. The anti-reflection film 186 may be arranged at a position overlapping the pixel isolation insulating film 120 defining the pixel region PXR in a vertical direction (Z direction) on an edge portion of the pixel region PXR. The top surface and sidewalls of the anti-reflection film 186 may be covered by a color filter CF. The anti-reflection film 186 may prevent incident light passing through the color filter CF from being laterally reflected or scattered. For example, the anti-reflection film 186 may prevent photons reflected or scattered at the interface between the color filter CF and the first planarization film 182 from moving to another pixel region. The anti-reflection film 186 may include a metal. For example, the anti-reflection film 186 may include tungsten (W), aluminum (A1), copper (Cu), or a combination thereof.

Although a partial configuration of the pixel region PXR included in the plurality of unit pixels PXU shown in FIG. 1 is illustrated in FIGS. 12A to 12D, the substrate 102 of the image sensor 100 may include a region including the plurality of unit pixels PXU described with reference to FIG. 1, a peripheral circuit region (not shown) arranged around the plurality of unit pixels PXU, and a pad region (not shown). The peripheral circuit region may be a region including various types of circuits configured to control the plurality of unit pixels (refer to PXU in FIG. 1). For example, the peripheral circuit region may include a plurality of transistors. The plurality of transistors in the peripheral circuit region may be driven to provide a constant signal to the photodiode PD formed in the pixel region PXR or control an output signal from the photodiode PD. For example, the plurality of transistors in the peripheral circuit region may constitute various types of logic circuits such as a timing generator, a row decoder, a row driver, a CDS, an ADC, a latch, and a column decoder. The pad region may include conductive pads electrically connected to the plurality of unit pixels PXU and the circuits in the peripheral circuit region. The conductive pads may function as connection terminals configured to supply power and signals to the plurality of unit pixels (refer to PXU in FIG. 1) and the circuits in the peripheral circuit region from the outside.

In the image sensor 100 described with reference to FIGS. 12A to 12D according to the inventive concept, the source follower transistor SF1 in the pixel region PXR may include the first active region AC11 and the gate electrode 150 on the first active region AC11. The edge portion, which extends along the outline of the top surface of the first active region AC11, may include the local round edge portion RE10 having a greater radius of curvature than other portions of the edge portion. The gate electrode 150 may include a lateral gate portion 150H on and at least partially covering the top surface of the first active region AC11, a vertical gate portion 150V on and at least partially covering the sidewall of the first active region AC11, and a round inner corner portion 150C facing the local round edge portion RE10 of the first active region AC11. Accordingly, the source follower transistor SF1 may have a local fin field-effect transistor (FinFET) structure including the gate electrode 150 on and at least partially covering only some of the sidewalls of the first active region AC11. In the source follower transistor SF1 having the local FinFET structure, a partial region of the first active region AC11, which faces the gate electrode 150, may include the local round edge portion RE10. Thus, even when the image sensor 100 is highly integrated and a size of the pixel region PXR is miniaturized, noise characteristics of pixels may be improved. Also, not only by increasing a channel area of the source follower transistor SF1 but also by easily ensuring a required level of limit voltage, electrical properties of transistors and low-luminance resolution of the image sensor 100 may be improved.

Although the image sensor 100 described with reference to FIGS. 12A to 12D pertains to an example structure in which the local round edge portion RE10 is formed in the first active region AC11 constituting the source follower transistor SF1, embodiments of the inventive concept are not limited thereto. For example, the second active region AC12 constituting the transfer transistor TX may also include a local round edge portion having substantially the same structure as the local round edge portion RE10.

In addition, although the image sensor 100 described with reference to FIGS. 12A to 12D pertains to an example in which the first active region AC11 constituting the source follower transistor SF1 has a similar structure to the active region AC1 described with reference to FIGS. 4A, 4B, and 4C, embodiments of the inventive concept are not limited thereto. For example, the image sensor 100 may include at least one transistor selected from the transistor TR1 described above with reference to FIGS. 4A, 4B, and 4C, the transistor TR2 described above with reference to FIGS. 5A, 5B, and 5C, the transistor TR3 described above with reference to FIG. 6), the transistor TR4 described above with reference to FIGS. 7A, 7B, and 7C, the transistor TR5 described above with reference to FIG. 8, the transistor TR6 described above with reference to FIG. 9, the transistor TR7 described above with reference to FIG. 10, the transistor TR8 described above with reference to FIGS. 11A and 11B, and transistors variously modified and changed therefrom in accordance with different embodiments of the inventive concept.

FIGS. 13A to 13H are cross-sectional views of a method of manufacturing an image sensor, according to embodiments. An example method of manufacturing the image sensor 100 described with reference to FIGS. 12A to 12D is described with reference to FIGS. 13A to 13H. FIGS. 13A to 13H each illustrate cross-sectional configurations of a region corresponding to a cross-section taken along line Y12-Y12' of FIG. 12A, according to a process sequence.

Figure 13A:
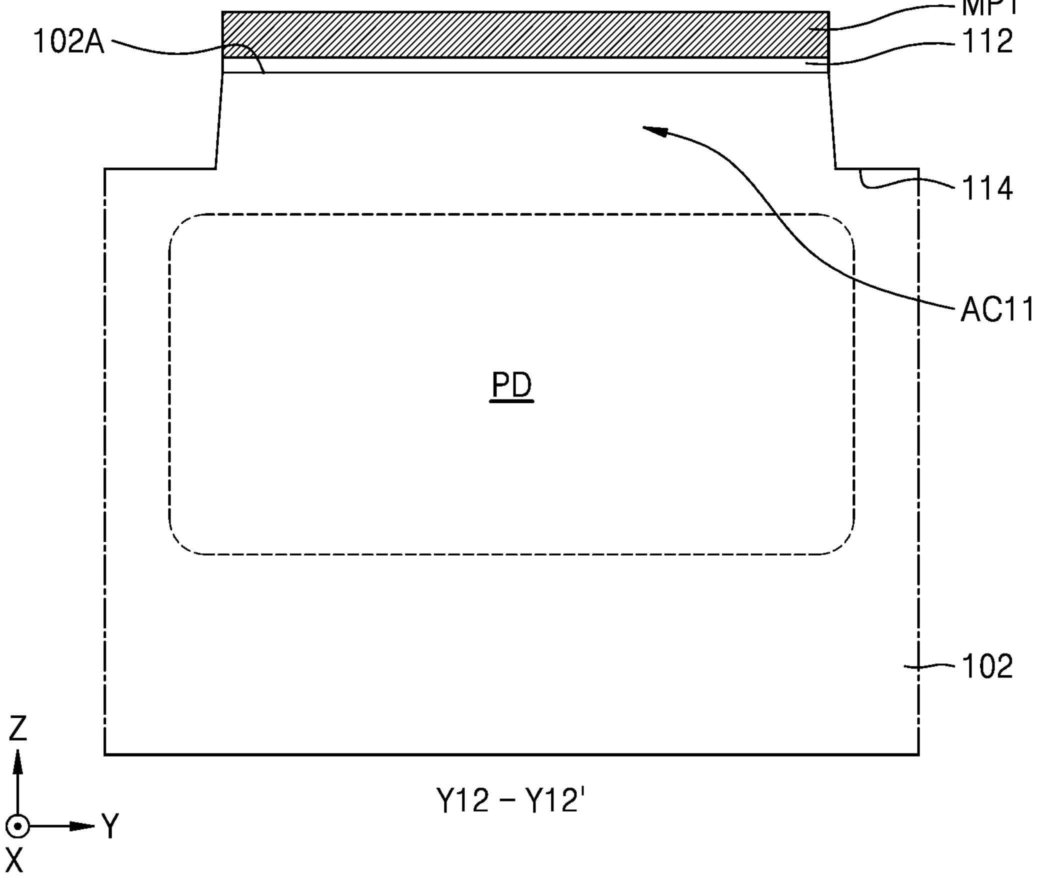
FIGS. 13A to 13H are cross-sectional views of a method of manufacturing an image sensor, according to embodiments.

Referring to FIG. 13A, a photodiode PD may be formed in a substrate 102, a buffer oxide film 112 and a mask pattern MP1 may be formed on a front side surface 102A of the substrate 102, and the substrate 102 may be anisotropically etched by using the mask pattern MP1 as an etch mask to form a device isolation trench 114. A plurality of active regions (refer to AC11, AC12, and AC13 in FIG. 12A) may be defined in the substrate 102 by the device isolation trench 114. In embodiments, the photodiode PD may be formed by doping N-type impurities into a partial region of the substrate 102.

In embodiments, the mask pattern MP1 may include a silicon nitride film or a silicon oxynitride film. A lowermost surface of the device isolation trench 114 may be formed apart from the photodiode PD. The process of forming the device isolation trench 114 may be performed before or after the process of forming the photodiode PD.

Figure 13B:
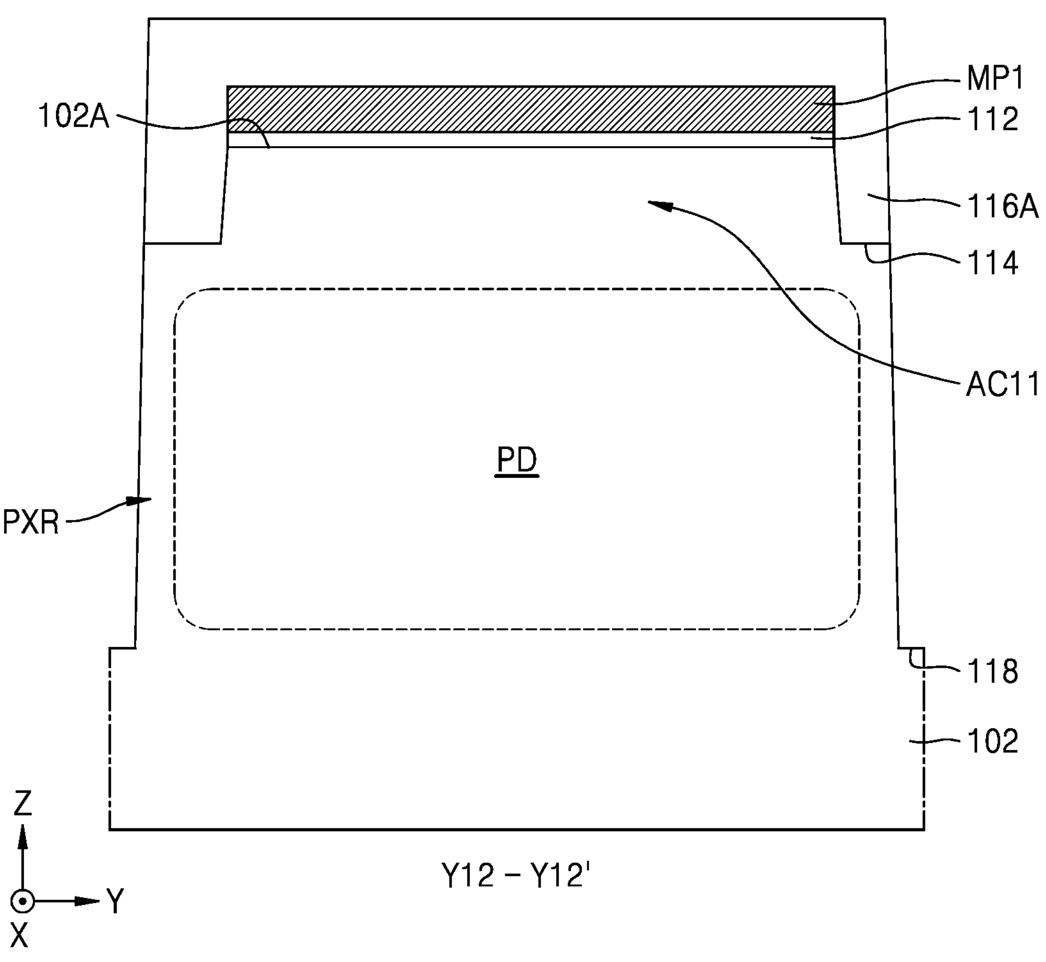

Referring to FIG. 13B, in the resultant structure of FIG. 13A, a device isolation insulating film 116A may be formed to at least partially fill the device isolation trench 114 and a top surface of the mask pattern MP1, and a portion of the device isolation insulating film 116A and a portion of the substrate 102 may be etched to form a pixel isolation trench 118. The pixel isolation trench 118 may be formed around the photodiode PD to border or surround the photodiode PD in a plan view. A pixel region PXR may be defined by the pixel isolation trench 118 in the substrate 102.

Figure 13C:
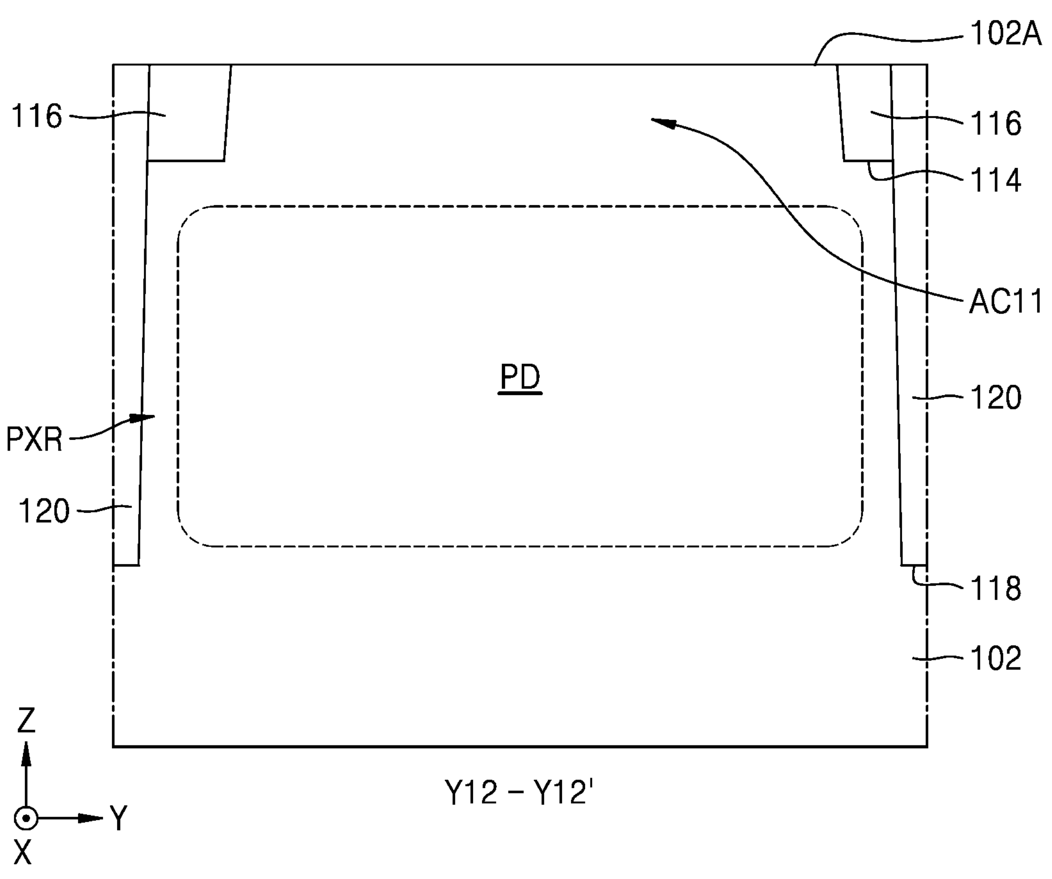

Referring to FIG. 13C, in the resultant structure of FIG. 13B, an insulating film may be formed to at least partially fill the pixel isolation trench 118. Thereafter, the mask pattern MP1 and the buffer oxide film 112 may be removed, and the insulating film may be planarized to expose the front side surface 102A of the substrate 102. As a result, a portion of the device isolation insulating film 116A, which at least partially fills the device isolation trench 114 may be left as a device isolation insulating structure 116, and a portion of the insulating film, which at least partially fills the pixel isolation trench 118, may be left as a pixel isolation insulating film 120.

In another example, the device isolation insulating structure 116 may be formed by implanting P-type impurities into the substrate 102.

Figure 13D:
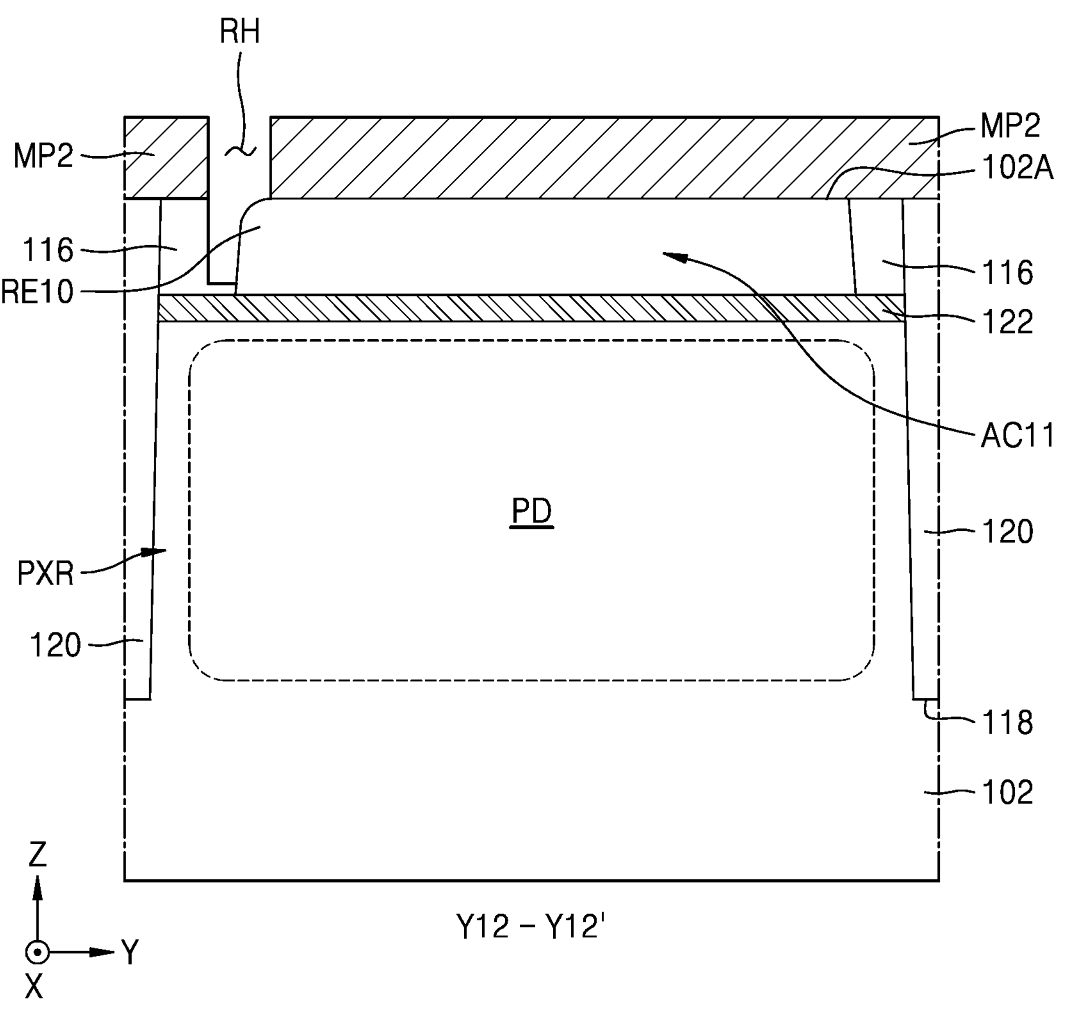

Referring to FIG. 13D, in the resultant structure of FIG. 13C, P-type impurities may be implanted into the substrate 102 to form a barrier region 122 on the photodiode PD, and a mask pattern MP2 may be formed on the front side surface 102A of the substrate 102. The mask pattern MP2 may have an opening RH exposing a portion of the device isolation insulating structure 116 and a portion of the first active region AC11. A position of the opening RH formed in the mask pattern MP2 may correspond to a position of the local region LA10 shown in FIG. 12A. The mask pattern MP2 may include a material having an etch selectivity with respect to each of the device isolation insulating structure 116 and the first active region AC11. For example, the mask pattern MP2 may include a silicon nitride film, without being limited thereto.

Afterwards, an etching process for etching a portion of each of the device isolation insulating structure 116 and the first active region AC11 that are exposed through the opening RH may be performed by using the mask pattern MP2 as an etch mask. However, the etching process may be performed in an etching atmosphere in which an etch rate of the device isolation insulating structure 116 is higher than an etch rate of the first active region AC11. As a result, a recess region exposing a sidewall of the first active region AC11 may be formed in the device isolation insulating structure 116, and a local round edge portion RE11 may be formed in an upper edge portion of a sidewall of the first active region AC11, which faces the device isolation insulating structure 116. An etching atmosphere and an etching time of the etching process may be adjusted such that a radius of curvature of the local round edge portion RE10 may be controlled within a desired range.

Figure 13E:
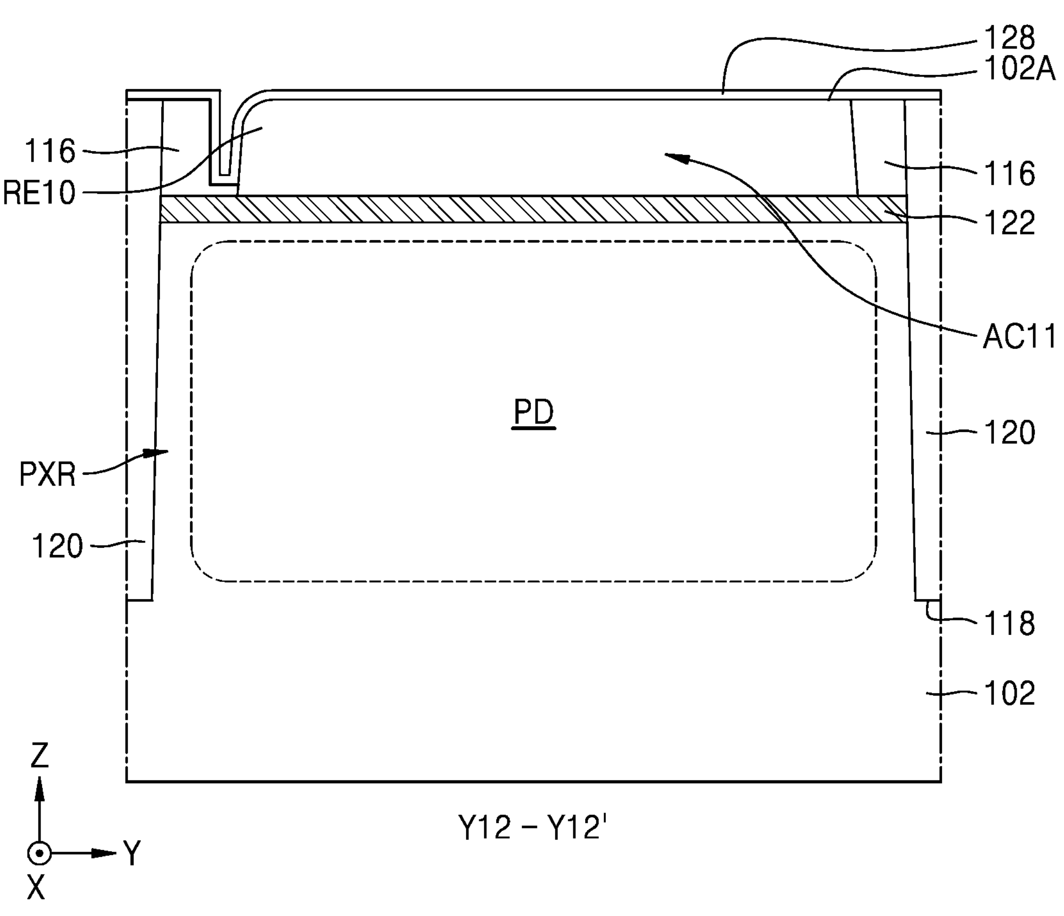

Referring to FIG. 13E, the mask pattern MP2 may be removed from the resultant structure of FIG. 13D to expose a top surface of the device isolation insulating structure 116 and a top surface of the first active region AC11. Thereafter, a gate dielectric film 128 may be formed to conformally at least partially cover exposed surfaces of the first active region AC11 and surfaces exposed on the front side surfaces 102A of the substrate 102.

During the formation of the gate dielectric film 128, gate dielectric films, which constitute the first and second the transfer transistor TX1 and TX2, the selection transistor SX, and the reset transistor RX described with reference to FIG. 2, or gate dielectric films, which constitute the first to fourth the transfer transistors TX1, TX2, TX3, and TX4, the selection transistor SX, and the reset transistor RX described with reference to FIG. 3, may be formed together or simultaneously.

Figure 13F:
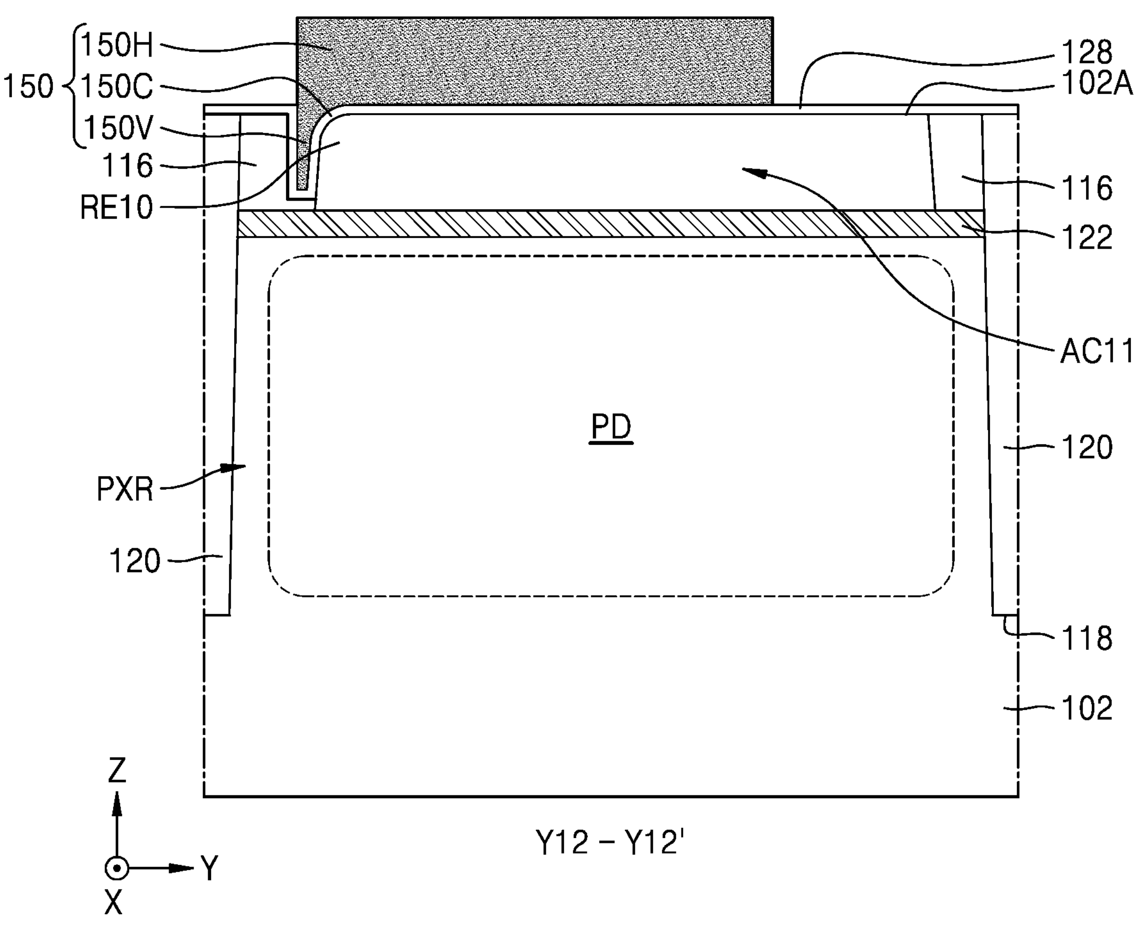

Referring to FIG. 13F, a gate electrode 150 may be formed on the gate dielectric film 128. The gate electrode 150 may include a lateral gate portion 150H, a round inner corner portion 150C, and a vertical gate portion 150V, which are integrally connected to each other, for example, to form a monolithic structure.

During the formation of the gate electrode 150, gate structures included in MOS transistors constituting readout circuits may be formed together on the front side surface 102A of the substrate 102. For example, during the formation of the gate electrode 150, gate structures, which constitute the first and second the transfer transistor TX1 and TX2, the selection transistor SX, and the reset transistor RX described with reference to FIG. 2, or gate structures, which constitute the first to fourth the transfer transistors TX1, TX2, TX3, and TX4, the selection transistor SX, and the reset transistor RX described with reference to FIG. 3, may be formed together or simultaneously.

Figure 13G:
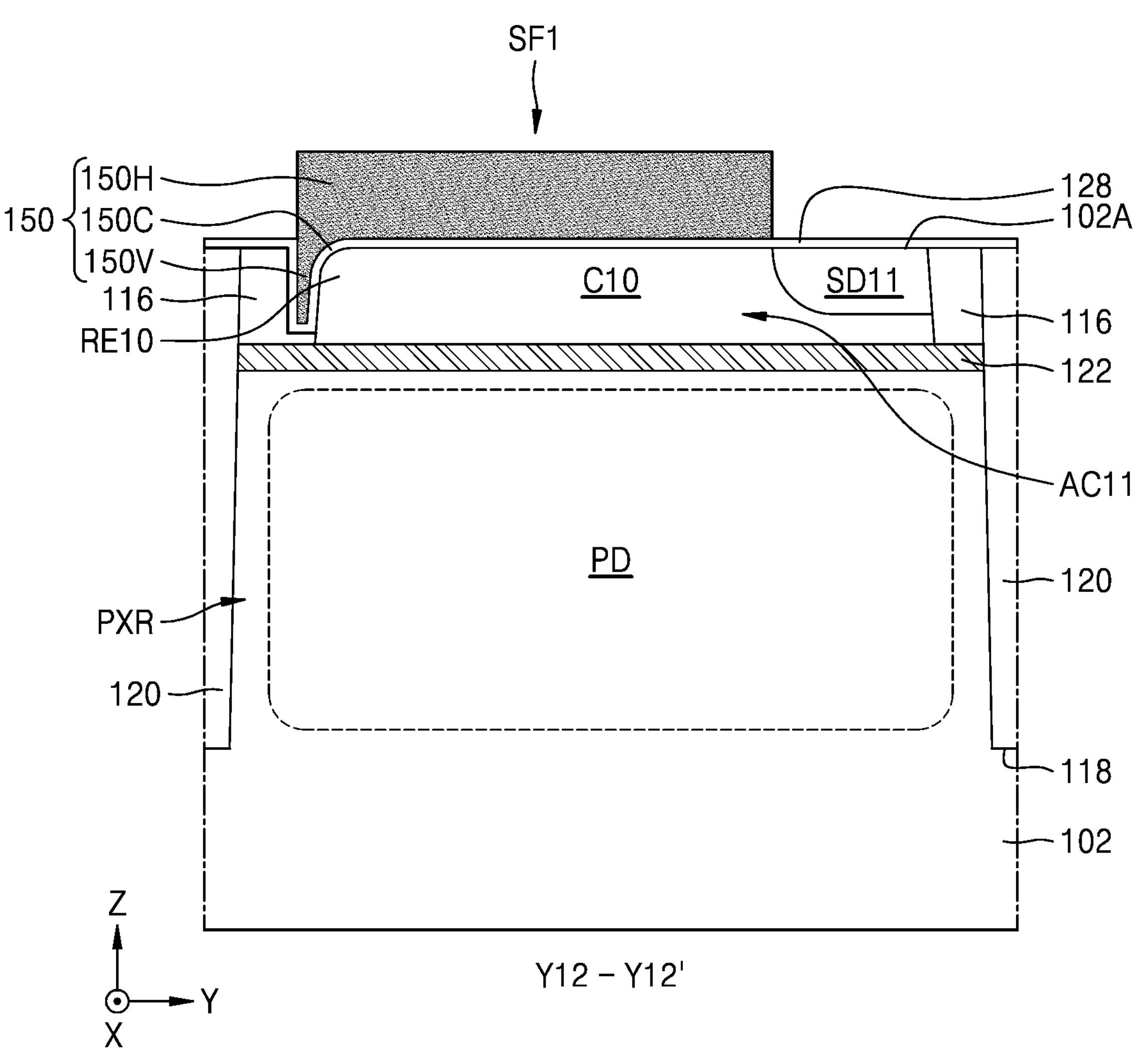

Referring to FIG. 13G, in the resultant structure of FIG. 13F, impurity ions may be implanted into the plurality of active regions (refer to AC11, AC12, and AC13 in FIG. 12A) including the first active region AC11, and thus, a plurality of impurity regions may be formed. The plurality of impurity regions may include a first source/drain region SD11 and a second source/drain region SD12, which are in the first active region AC11. By forming the first source/drain region SD11 and the second source/drain region SD12 in the first active region AC11, a source follower transistor SF1, which is on the first active region AC11, may be obtained.

Figure 13H:
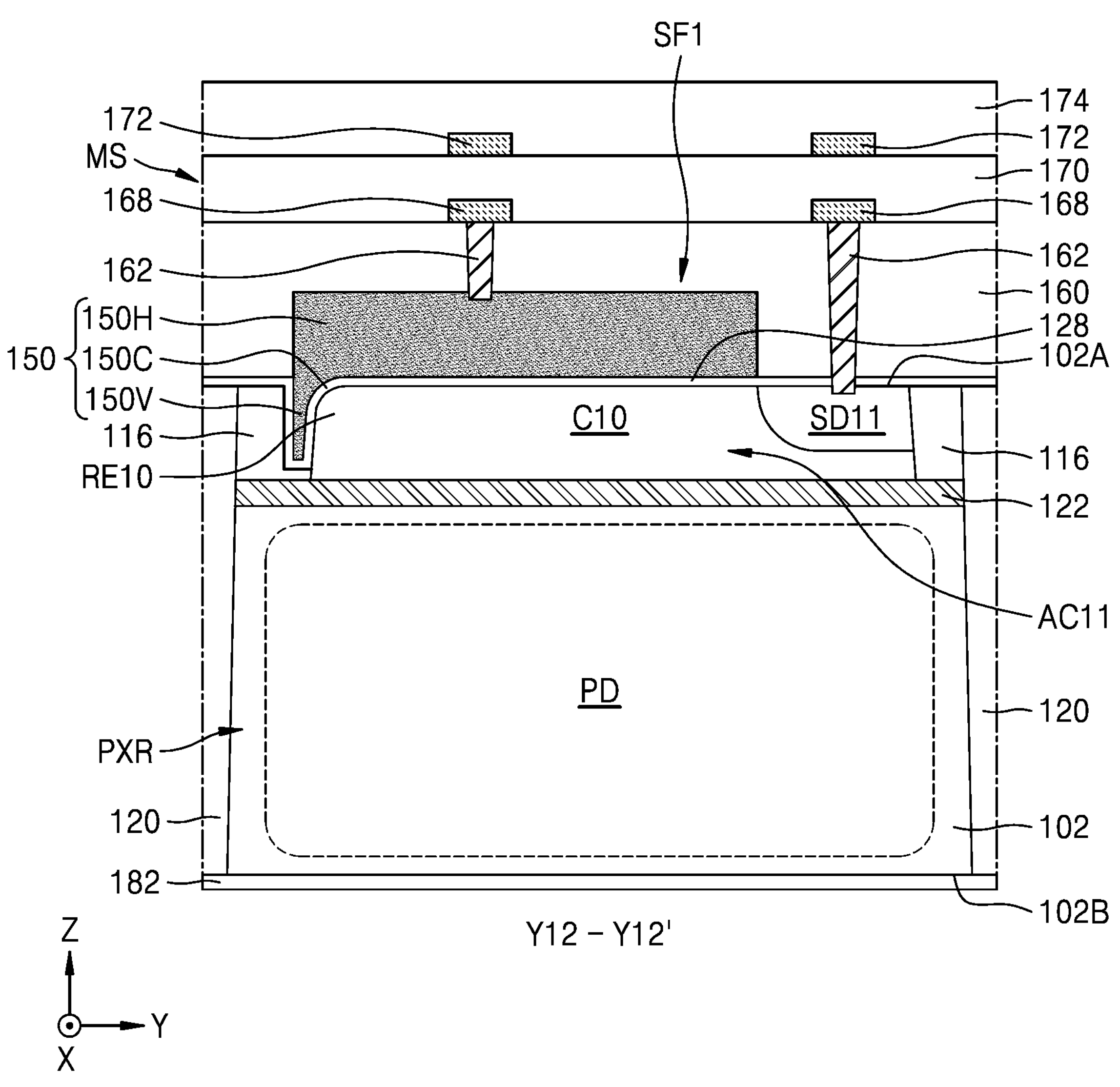

Referring to FIG. 13H, in the resultant structure of FIG. 13G, an interlayer insulating film 160 may be formed to be on and at least partially cover the front side surface 102A of the substrate 102 and a plurality of transistors including the source follower transistor SF1. Thereafter, a plurality of contact plugs 162 may be formed to pass through the interlayer insulating film 160 and be connected to the plurality of transistors. A plurality of conductive lines 168 may be formed on the interlayer insulating film 160. The plurality of conductive lines 168 may be connectable to the plurality of transistors through the plurality of contact plugs 162.

The plurality of contact plugs 162 may include the contact plugs 162, which are respectively connected to the lateral gate portion 150H, the first source/drain region SD11, and the second source/drain region SD12 of the source follower transistor SF1. Although not shown, the plurality of contact plugs 162 may further include contact plugs, which are respectively connected to the gate structures, which constitute the first and second the transfer transistor TX1 and TX2, the selection transistor SX, and the reset transistor RX described with reference to FIG. 2, and the impurity regions or further include the contact plugs 162, which are respectively connected to the gate structures, which constitute the first to fourth the transfer transistors TX1, TX2, TX3, and TX4, the selection transistor SX, and the reset transistor RX described with reference to FIG. 3, and the impurity regions. During the formation of the plurality of contact plugs 162, the contact plug 164 shown in FIG. 12A may be formed together.

Thereafter, a plurality of interlayer insulating films (e.g., 170 and 174) and a plurality of conductive lines 172 may be formed. The plurality of interlayer insulating films (e.g., 170 and 174) and the plurality of conductive lines 172 may constitute a wiring structure MS on and at least partially covering the front side surface 102A of the substrate 102 along the interlayer insulating film 160 and the plurality of conductive lines 168.

After the wiring structure MS is formed, a thickness of the substrate 102 may be reduced while adhering a support substrate (not shown) onto the wiring structure MS. To reduce the thickness of the substrate 102, a mechanical grinding process, a chemical mechanical polishing (CMP) process, a wet etching process, or a combination thereof may be used. As a result, the pixel isolation insulating film 120 may be exposed at a back side surface 102B, which is an opposite surface of the front side surface 102A of the substrate 102. A first planarization film 182 may be formed on an exposed back side surface 102B of the substrate 102 and an exposed surface of the pixel isolation insulating film 120.

Thereafter, as shown in FIGS. 12B to 12D, an anti-reflection film 186, a color filter CF, a second planarization film 184, a microlens ML, and a protective capping film 188 may be sequentially formed on the first planarization film 182 to form a light-transmitting structure LTS. Afterwards, the support substrate covering the wiring structure MS may be removed to manufacture the image sensor 100 shown in FIGS. 12A to 12D.

Although the method of manufacturing the image sensor 100 illustrated in FIGS. 12A to 12D has been described with reference to FIGS. 13A to 13H, various modifications and changes may be made within the scope of the inventive concept to manufacture image sensors variously modified and changed therefrom within the scope of the inventive concept.

Figure 14A:
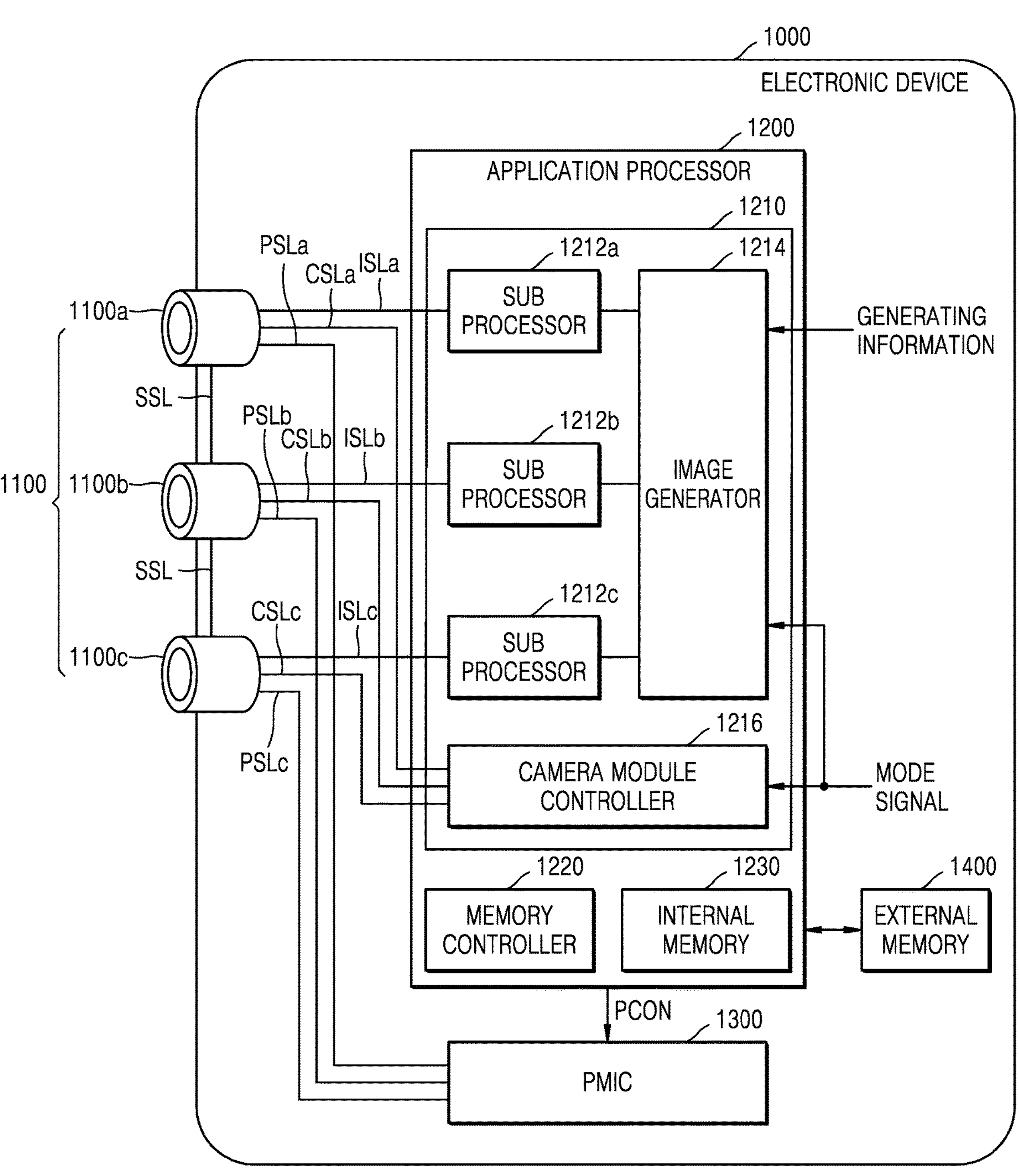
FIG. 14A is a block diagram of an electronic system according to embodiments.
Figure 14B:
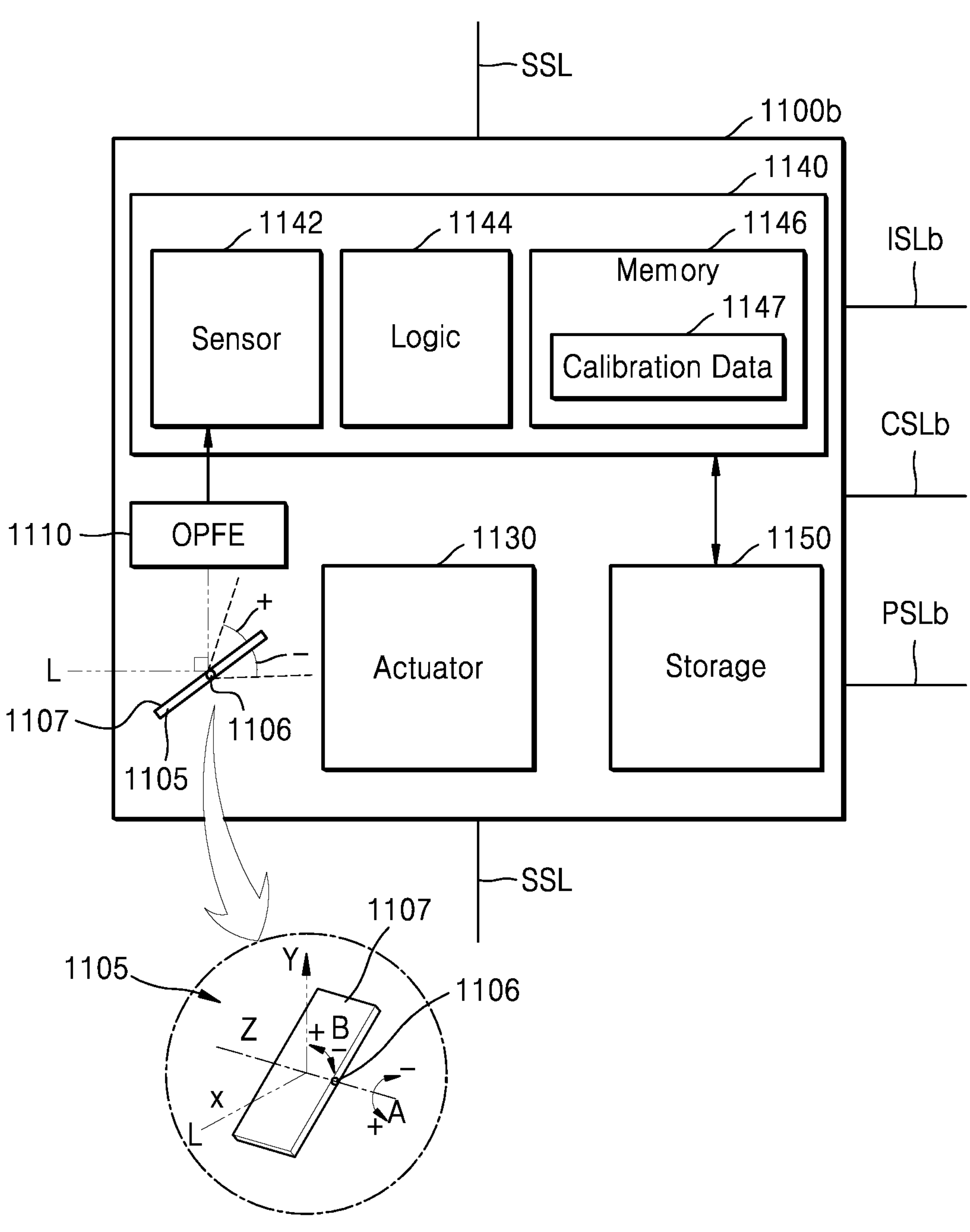
FIG. 14B is a detailed block diagram of a camera module included in the electronic system of FIG. 14A.

FIG. 14A is a block diagram of an electronic system according to embodiments, and FIG. 14B is a detailed block diagram of a camera module included in the electronic system of FIG. 14A.

Referring to FIG. 14A, the electronic device 1000 may include a camera module group 1100, an application processor 1200, a power management integrated circuit (PMIC) 1300, and an external memory 1400.

The camera module group 1100 may include a plurality of camera modules (e.g., 1100*a*, 1100*b*, and 1100*c*). Although three camera modules 1100*a*, 1100*b*, and 1100*c* are illustrated in FIG. 15, embodiments of the inventive concept are not limited thereto. In some embodiments, the camera module group 1100 may be modified to include only two camera modules. In some embodiments, the camera module group 1100 may be modified to include n camera modules, where n is a natural number of 4 or more.

The detailed configuration of the camera module 1100*b* will be described with reference to FIG. 14B below. The descriptions below may be also applied to the other camera modules 1100*a* and 1100*c*.

Referring to FIG. 14B, the camera module 1100*b* may include a prism 1105, an optical path folding element (OPFE) 1110, an actuator 1130, an image sensing device 1140, and a storage 1150.

The prism 1105 may include a reflective surface 1107 of a light reflecting material and may change the path of light L incident from the outside.

In some embodiments, the prism 1105 may be configured to change the path of the light L incident in a first direction (X direction in FIG. 14B) into a second direction (Y direction in FIG. 14B) that is perpendicular to the first direction. The prism 1105 may be configured to rotate the reflective surface 1107 of the light reflecting material in a direction A around a central shaft 1106 or rotate the central shaft 1106 in a direction B to change the path of the light L incident in the first direction (X direction in FIG. 14B) into the second direction (Y direction in FIG. 14B) perpendicular to the first direction. In this case, the OPFE 1110 may move in a third direction (Z direction in FIG. 14B), which is perpendicular to the first direction (X direction in FIG. 14B) and the second direction (Y direction in FIG. 14B).

In some embodiments, as shown in FIG. 14B, an A-direction maximum rotation angle of the prism 1105 may be less than or equal to about 15 degrees in a plus (+) A direction and greater than about 15 degrees in a minus (−) A direction, but embodiments are not limited thereto.

In some embodiments, the prism 1105 may be configured to move by an angle of about 20 degrees or in a range from about 10 degrees to about 20 degrees or from about 15 degrees to about 20 degrees in a plus or minus B direction. In this case, an angle by which the prism 1105 moves in the plus B direction may be the same as or similar, within a difference of about 1 degree, to an angle by which the prism 1105 moves in the minus B direction.

In some embodiments, the prism 1105 may be configured to move the reflective surface 1107 of the light reflecting material in the third direction (e.g., Z direction in FIG. 14B) parallel with an extension direction of the central shaft 1106.

The OPFE 1110 may include, for example, "m" optical lenses, where "m" is a natural number. The m lenses may be configured to move in the second direction (or Y direction in FIG. 14B) and be configured to change an optical zoom ratio of the camera module 1100*b*. For example, when the default optical zoom ratio of the camera module 1100*b* is Z, the optical zoom ratio of the camera module 1100*b* may be changed to 3 Z or 5 Z or greater by moving the m optical lenses included in the OPFE 1110.

The actuator 1130 may be configured to move the OPFE 1110 or an optical lens to a certain position. For example, the actuator 1130 may be configured to adjust the position of the optical lens such that an image sensor 1142 is positioned at a focal length of the optical lens for accurate sensing.

The image sensing device 1140 may include the image sensor 1142, a control logic 1144, and a memory 1146. The image sensor 1142 may be configured to sense an image of an object using the light L provided through the optical lens. The control logic 1144 may be configured to control all operations of the camera module 1100*b*. For example, the control logic 1144 may be configured to control operation of the camera module 1100*b* according to a control signal provided through a control signal line CSLb.

The memory 1146 may be configured to store information, such as calibration data 1147, used in the operation of the camera module 1100*b*. The calibration data 1147 may include information, which is used by the camera module 1100*b* to generate image data using the light L provided from outside. The calibration data 1147 may include information about a degree of rotation, information about a focal length, information about an optical axis, or the like. When the camera module 1100*b* is implemented as a multi-state camera that has a focal length varying with the position of the optical lens, the calibration data 1147 may include a value of a focal length for each position (or state) of the optical lens and information about auto focusing.

The storage 1150 may be configured to store image data sensed by the image sensor 1142. The storage 1150 may be provided outside the image sensing device 1140 and may form a stack with a sensor chip of the image sensing device 1140. In some embodiments, although the storage 1150 may include electrically erasable programmable read-only memory (EEPROM), embodiments are not limited thereto.

The image sensor 1142 may include the image sensor 100 described with reference to FIGS. 12A to 12D or image sensors variously modified and changed therefrom within the scope of the inventive concept.

Referring to FIGS. 14A and 14B, in some embodiments, each of the camera modules 1100*a*, 1100*b*, and 1100*c* may include the actuator 1130. Accordingly, the camera modules 1100*a*, 1100*b*, and 1100*c* may include the calibration data 1147, which is the same or different among the camera modules 1100*a*, 1100*b*, and 1100*c* according to the operation of the actuator 1130 included in each of the camera modules 1100*a*, 1100*b*, and 1100*c*.

In some embodiments, one (e.g., the camera module 1100*b*) of the camera modules 1100*a*, 1100*b*, and 1100*c* may be of a folded-lens type including the prism 1105 and the OPFE 1110, which are described above, while the other camera modules (e.g., the camera modules 1100*a* and 1100*c*) may be of a vertical type that does not include the prism 1105 and the OPFE 1110. However, embodiments are not limited thereto.

In some embodiments, one (e.g., the camera module 1100*c*) of the camera modules 1100*a*, 1100*b*, and 1100*c* may include a vertical depth camera, which extracts depth information using an infrared ray (IR). In this case, the application processor 1200 may generate a three-dimensional (3D) depth image by merging image data provided from the depth camera with image data provided from another camera module (e.g., the camera module 1100*a* or 1100*b*).

In some embodiments, at least two camera modules (e.g., 1100*a* and 1100*b*) among the camera modules 1100*a*, 1100*b*, and 1100*c* may have different field-of-views. In this case, for example, the two camera modules (e.g., 1100*a* and 1100*b*) among the camera modules 1100*a*, 1100*b*, and 1100*c* may respectively have different optical lenses. However, embodiments are not limited thereto.

In some embodiments, the camera modules 1100*a*, 1100*b*, and 1100*c* may have different field-of-views from each other. In this case, although the camera modules 1100*a*, 1100*b*, and 1100*c* may respectively have different optical lenses, the inventive concept is not limited thereto.

In some embodiments, the camera modules 1100*a*, 1100*b*, and 1100*c* may be physically separated from one another. In other words, a sensing region of the image sensor 1142 is not divided and used by the camera modules 1100*a*, 1100*b*, and 1100*c*, but the image sensor 1142 may be independently included in each of the camera modules 1100*a*, 1100*b*, and 1100*c*.

Referring to FIG. 14A, the application processor 1200 may include an image processing device 1210, a memory controller 1220, and an internal memory 1230. The application processor 1200 may be separately implemented from the camera modules 1100*a*, 1100*b*, and 1100*c*. For example, the application processor 1200 and the camera modules 1100*a*, 1100*b*, and 1100*c* may be implemented in different semiconductor chips and separated from each other.

The image processing unit 1210 may include a plurality of sub-processors (e.g., 1212*a*, 1212*b*, and 1212*c*), an image generator 1214, and a camera module controller 1216. The image processing device 1210 may include sub-processors (e.g., 1212*a*, 1212*b*, and 1212*c*) in number corresponding to the number of camera modules (e.g., 1100*a*, 1100*b*, 1100*c*).

Pieces of image data respectively generated by the camera modules 1100*a*, 1100*b*, and 1100*c* may be respectively provided to the corresponding ones of the sub-processors 1212*a*, 1212*b*, and 1212*c* through image signal lines ISLa, ISLb, and ISLc separated from each other. For example, image data generated by the camera module 1100*a* may be provided to the sub-processor 1212*a* through the image signal line ISLa, image data generated by the camera module 1100*b* may be provided to the sub-processor 1212*b* through the image signal line ISLb, and image data generated by the camera module 1100*c* may be provided to the sub-processor 1212*c* through the image signal line ISLc. Such image data transmission may be performed using, for example, a mobile industry processor interface (MIPI)-based camera serial interface (CSI). However, the inventive concept is not limited thereto.

In some embodiments, a single sub-processor may be arranged to correspond to a plurality of camera modules. For example, differently from FIG. 14A, the sub-processors 1212*a* and 1212*c* may not be separated but may be integrated into a single sub-processor, and the image data provided from the camera module 1100*a* or the camera module 1100*c* may be selected by a selection element (e.g., a multiplexer) and then provided to the integrated sub-processor.

The image data provided to each of the sub-processors 1212*a*, 1212*b*, and 1212*c* may be provided to the image generator 1214. The image generator 1214 may be configured to generate an output image by using the image data provided from each of the sub-processors 1212*a*, 1212*b*, and 1212*c* according to image generation information or a mode signal.

Specifically, the image generator 1214 may be configured to generate the output image by merging at least portions of respective pieces of image data, which are respectively generated by the camera modules 1100*a*, 1100*b*, and 1100*c* having different field-of-views, according to the image generation information or the mode signal. Alternatively, the image generator 1214 may be configured to generate the output image by selecting one of pieces of image data, which are respectively generated by the camera modules 1100*a*, 1100*b*, and 1100*c* having different field-of-views, according to the image generation information or the mode signal.

In some embodiments, the image generating information may include a zoom signal or a zoom factor. In some embodiments, the mode signal may be based on a mode selected by a user.

When the image generation information includes a zoom signal or a zoom factor and the camera modules 1100*a*, 1100*b*, and 1100*c* have different field-of-views, the image generator 1214 may be configured to perform different operations according to different kinds of zoom signals. For example, when the zoom signal is a first signal, the image generator 1214 may be configured to merge image data output from the camera module 1100*a* and image data output from the camera module 1100*c* and then generate an output image by using a merged image signal and image data output from the camera module 1100*b* and not used for merging. When the zoom signal is a second signal different from the first signal, the image generator 1214 may generate an output image by selecting one of the pieces of image data respectively output from the camera modules 1100*a*, 1100*b*, and 1100*c*, instead of performing the merging. However, embodiments of the inventive concept are not limited thereto, and a method of processing image data may be changed whenever necessary.

In some embodiments, the image generator 1214 may receive a plurality of pieces of image data, which have different exposure times, from at least one of the sub-processors 1212*a*, 1212*b*, and 1212*c* and perform high dynamic range (HDR) processing on the pieces of image data, thereby generating merged image data having an increased dynamic range.

The camera module controller 1216 may provide a control signal to each of the camera modules 1100*a*, 1100*b*, and 1100*c*. A control signal generated by the camera module controller 1216 may be provided to a corresponding one of the camera modules 1100*a*, 1100*b*, and 1100*c* through a corresponding one of control signal lines CSLa, CSLb, and CSLc, which are separated from one another.

One (e.g., the camera module 1100*b*) of the camera modules 1100*a*, 1100*b*, and 1100*c* may be designated as a master camera according to the mode signal or the image generation signal including a zoom signal, and the other camera modules (e.g., the camera modules 1100*a* and 1100*c*) may be designated as slave cameras. Such designation information may be included in a control signal and provided to each of the camera modules 1100*a*, 1100*b*, and 1100*c* through a corresponding one of the control signal lines CSLa, CSLb, and CSLc, which are separated from one another.

A camera module operating as a master or a slave may be changed according to a zoom factor or an operation mode signal. For example, when the field-of-view of the camera module 1100*a* is greater than that of the camera module 1100*b* and the zoom factor indicates a low zoom ratio, the camera module 1100*b* may operate as a master and the camera module 1100*a* may operate as a slave. Conversely, when the zoom factor indicates a high zoom ratio, the camera module 1100*a* may operate as a master and the camera module 1100*b* may operate as a slave.

In some embodiments, a control signal provided from the camera module controller 1216 to each of the camera modules 1100*a*, 1100*b*, and 1100*c* may include a sync enable signal. For example, when the camera module 1100*b* is a master camera and the camera modules 1100*a* and 1100*c* are slave cameras, the camera module controller 1216 may be configured to transmit the sync enable signal to the camera module 1100*b*. The camera module 1100*b* provided with the sync enable signal may be configured to generate a sync signal based on the sync enable signal and may provide the sync signal to the camera modules 1100*a* and 1100*c* through a sync signal line SSL. The camera modules 1100*a*, 1100*b*, and 1100*c* may be synchronized with the sync signal and may transmit image data to the application processor 1200.

In some embodiments, a control signal provided from the camera module controller 1216 to each of the camera modules 1100*a*, 1100*b*, and 1100*c* may include mode information according to the mode signal. The camera modules 1100*a*, 1100*b*, and 1100*c* may operate in a first operation mode or a second operation mode in relation with a sensing speed based on the mode information.

In the first operation mode, the camera modules 1100*a*, 1100*b*, and 1100*c* may be configured to generate an image signal at a first speed (e.g., at a first frame rate), encode the image signal at a second speed higher than the first speed (e.g., at a second frame rate higher than the first frame rate), and transmit an encoded image signal to the application processor 1200. In this case, the second speed may be 30 times or less the first speed.

The application processor 1200 may be configured to store the received image signal (i.e., the encoded image signal) in the internal memory 1230 therein or the external memory 1400 outside the application processor 1200. Thereafter, the application processor 1200 may read the encoded image signal from the internal memory 1230 or the external memory 1400, decode the encoded image signal, and display image data generated based on a decoded image signal. For example, a corresponding one of the sub-processors 1212*a*, 1212*b*, and 1212*c* of the image processing unit 1210 may be configured to perform the decoding and may also perform image processing on the decoded image signal.

In the second operation mode, the camera modules 1100*a*, 1100*b*, and 1100*c* may be configured to generate an image signal at a third speed lower than the first speed (e.g., at a third frame rate lower than the first frame rate) and transmit the image signal to the application processor 1200. The image signal provided to the application processor 1200 may not have been encoded. The application processor 1200 may be configured to perform image processing on the image signal or store the image signal in the internal memory 1230 or the external memory 1400.

The PMIC 1300 may provide power (e.g., a power supply voltage) to each of the camera modules 1100*a*, 1100*b*, and 1100*c*. For example, under control by the application processor 1200, the PMIC 1300 may provide first power to the camera module 1100*a* through a power signal line PSLa, second power to the camera module 1100*b* through a power signal line PSLb, and third power to the camera module 1100*c* through a power signal line PSLc.

The PMIC 1300 may be configured to generate power corresponding to each of the camera modules 1100*a*, 1100*b*, and 1100*c* and adjust the level of the power, in response to a power control signal PCON from the application processor 1200. The power control signal PCON may include a power adjustment signal for each operation mode of the camera modules 1100*a*, 1100*b*, and 1100*c*. For example, the operation mode may include a low-power mode. In this case, the power control signal PCON may include information about a camera module configured to operate in the low-power mode and a power level to be set. The same or different levels of power may be respectively provided to the camera modules 1100_a_, 1100_b_, and 1100_c_. The level of power may be dynamically changed.

While the inventive concept has been particularly shown and described with reference to embodiments thereof, it will be understood that various changes in form and details may be made therein without departing from the spirit and scope of the following claims.

What is claimed is:

1. An image sensor comprising:

a substrate having a pixel region in which an active region is defined; and a gate electrode on the active region, wherein the active region comprises a top surface, a plurality of sidewalls extending in different directions from the top surface, and an edge portion extending along an outline of the top surface between the top surface and the plurality of sidewalls, the edge portion comprising a local round edge portion having a first radius of curvature that is greater than a second radius of curvature of other portions of the edge portion, wherein the gate electrode comprises a lateral gate portion on a portion of the top surface of the active region, a vertical gate portion on one sidewall adjacent to the local round edge portion from among the plurality of sidewalls of the active region, and a round inner corner portion integrally connected to the lateral gate portion and the vertical gate portion, the round inner corner portion facing the local round edge portion.

2. The image sensor of claim 1, wherein the active region has an L-shaped planar form including a bending portion, and the local round edge portion is in the bending portion.

3. The image sensor of claim 1, wherein the active region comprises a bending portion and a linear extension extending in a first lateral direction from the bending portion, and wherein the local round edge portion comprises a portion extending along the edge portion in the bending portion and the linear extension.

4. The image sensor of claim 1, wherein the active region comprises a linear extension extending in a first lateral direction, and wherein the local round edge portion comprises a portion extending along the edge portion in the linear extension.

5. The image sensor of claim 1, wherein the gate electrode is on a local region in which the local round edge portion of the edge portion of the active region is located, and is on a normal edge portion of the edge portion, which is outside the local region, and wherein the vertical gate portion is in the local region.

6. The image sensor of claim 1, wherein, in the active region, the first radius of curvature is at least about 20 nm, and the second radius of curvature is about 8 nm or less.

7. The image sensor of claim 1, further comprising:

first and second source/drain regions formed on both sides of the gate electrode in the active region, the first and second source/drain regions being apart from each other with the local round edge portion therebetween; and a gate dielectric film between the active region and the gate electrode.

8. The image sensor of claim 1, wherein, in the active region, the local round edge portion is in only one of both side portions of the active region in a direction orthogonal to a channel direction formed in the active region.

9. The image sensor of claim 1, further comprising a device isolation insulating structure defining the active region, wherein the gate electrode is on a local top surface adjacent to the local round edge portion, of the top surface of the active region, and a local sidewall adjacent to the local round edge portion, from among the plurality of sidewalls of the active region, and wherein the device isolation insulating structure is on a sidewall opposite to the local sidewall.

10. The image sensor of claim 1, further comprising first and second source/drain regions on both sides of the gate electrode in the active region, the first and second source/drain regions being at different distances from the local round edge portion.

11. An image sensor comprising:

a substrate having a pixel region in which an active region is defined by a device isolation insulating structure; and a source follower transistor comprising a gate electrode on a portion of the active region, wherein the active region comprises an edge portion extending along an outline of a top surface of the active region, the edge portion comprising a normal edge portion in contact with the device isolation insulating structure and a local round edge portion apart from the device isolation insulating structure, and a first radius of curvature of the local round edge portion is greater than a second radius of curvature of the normal edge portion, and wherein the gate electrode comprises a lateral gate portion on a portion of the top surface of the active region, a vertical gate portion on one sidewall adjacent to the local round edge portion, from among a plurality of sidewalls of the active region, and a round inner corner portion integrally connected to the lateral gate portion and the vertical gate portion, the round inner corner portion facing the local round edge portion.

12. The image sensor of claim 11, wherein the active region has an L-shaped planar form comprising a bending portion, and the local round edge portion is in the bending portion.

13. The image sensor of claim 11, wherein the first radius of curvature is in a range of about 20 nm to about 50 nm, and the second radius of curvature is in a range of about 0.1 nm to about 8 nm.

14. The image sensor of claim 11, wherein the source follower transistor comprises:

first and second source/drain regions formed on both sides of the gate electrode in the active region, the first and second source/drain regions being apart from each other with the local round edge portion therebetween; and a gate dielectric film between the active region and the gate electrode.

15. The image sensor of claim 11, wherein, in the active region, the local round edge portion is in only one of both side portions of the active region in a direction orthogonal to a channel direction formed in the active region.

16. The image sensor of claim 11, wherein the vertical gate portion is on a local top surface adjacent to the local round edge portion, of the top surface of the active region, and a local sidewall adjacent to the local round edge portion, from among the plurality of sidewalls of the active region, and wherein the device isolation insulating structure is on a sidewall, from among the plurality of sidewalls of the active region, opposite to the local sidewall.

17. The image sensor of claim 11, wherein the vertical gate portion is between the local round edge portion of the active region and the device isolation insulating structure.

18. An electronic system comprising:

at least one camera module comprising an image sensor; and a processor configured to process image data received from the at least one camera module, wherein the image sensor comprises:

a substrate having a pixel region in which an active region is defined; and a gate electrode on the active region, wherein the active region comprises a top surface, a plurality of sidewalls extending in different directions from the top surface, and an edge portion extending along an outline of the top surface between the top surface and the plurality of sidewalls, the edge portion comprising a local round edge portion having a first radius of curvature that is greater than a second radius of curvature of other portions of the edge portion, wherein the gate electrode comprises a lateral gate portion on a portion of the top surface of the active region, a vertical gate portion on one sidewall adjacent to the local round edge portion, from among the plurality of sidewalls of the active region, and a round inner corner portion integrally connected to the vertical gate portion, the round inner corner portion facing the local round edge portion.

19. The electronic system of claim 18, wherein the active region has an L-shaped planar form having a bending portion, wherein the local round edge portion is in the bending portion, and, wherein the first radius of curvature is at least about 20 nm, and the second radius of curvature of about 8 nm or less.

20. The electronic system of claim 18, wherein the image sensor further comprises:

first and second source/drain regions on both sides of the gate electrode in the active region, the first and second source/drain regions being apart from each other with the local round edge portion therebetween;

a gate dielectric film between the active region and the gate electrode; and a device isolation insulating structure defining the active region, wherein the gate electrode is on a local top surface adjacent to the local round edge portion, of the top surface of the active region, and a local sidewall adjacent to the local round edge portion, from among the plurality of sidewalls of the active region, and wherein the device isolation insulating structure is on a sidewall opposite to the local sidewall.

* * * * *